United States Patent
Choi

(10) Patent No.: US 11,217,326 B2
(45) Date of Patent: Jan. 4, 2022

(54) SEMICONDUCTOR MEMORY DEVICE, A CONTROLLER, AND OPERATING METHODS OF THE SEMICONDUCTOR MEMORY DEVICE AND THE CONTROLLER

(71) Applicant: SK hynix Inc., Icheon-si (KR)

(72) Inventor: Jung Sik Choi, Seoul (KR)

(73) Assignee: SK hynix Inc., Icheon-si (KR)

( * ) Notice: Subject to any disclaimer, the term of this patent is extended or adjusted under 35 U.S.C. 154(b) by 50 days.

(21) Appl. No.: 16/889,446

(22) Filed: Jun. 1, 2020

(65) Prior Publication Data

US 2021/0183464 A1 Jun. 17, 2021

(30) Foreign Application Priority Data

Dec. 16, 2019 (KR) .................. 10-2019-0168216

(51) Int. Cl.
| | | |
|---|---|---|
| *G11C 16/10* | (2006.01) | |
| *G11C 16/34* | (2006.01) | |
| *G11C 29/00* | (2006.01) | |
| *G11C 29/44* | (2006.01) | |
| *G06F 12/0882* | (2016.01) | |
| *G11C 29/52* | (2006.01) | |

(52) U.S. Cl.
CPC .......... *G11C 29/78* (2013.01); *G06F 12/0882* (2013.01); *G11C 16/10* (2013.01); *G11C 29/44* (2013.01); *G11C 29/52* (2013.01); *G11C 29/76* (2013.01); *G06F 2212/7209* (2013.01)

(58) Field of Classification Search
CPC ......... G11C 29/78; G11C 29/76; G11C 29/44; G11C 16/10; G11C 29/52; G11C 16/3459; G11C 16/0483; G11C 16/3436; G11C 16/26; G11C 16/08; G11C 16/34; G06F 12/0882; G06F 2212/7209; G06F 3/0619

See application file for complete search history.

(56) References Cited

U.S. PATENT DOCUMENTS

| 10,249,383 B2* | 4/2019 | Han ...................... G11C 16/26 |
| 10,990,552 B1* | 4/2021 | Bilski ................. G06F 13/4282 |
| 2018/0061510 A1* | 3/2018 | Han ....................... G11C 16/10 |

FOREIGN PATENT DOCUMENTS

| KR | 1020170100875 A | 9/2017 |
| KR | 101807346 B1 | 12/2017 |
| KR | 1020180072026 A | 6/2018 |

* cited by examiner

*Primary Examiner* — Jay W. Radke
(74) *Attorney, Agent, or Firm* — William Park & Associates LTD.

(57) ABSTRACT

A semiconductor memory device includes a memory cell array, a read/write circuit, control logic, and a bit flip sensor. The memory cell array includes a plurality of memory cells. The read/write circuit is configured to receive program data, and perform a program operation on selected memory cells among the plurality of memory cells, based on the program data. The bit flip sensor is configured to receive the program data from the read/write circuit, and determine whether a bit flip has occurred in the program data. The control logic is configured to control the program operation of the read/write circuit, and generate program status information, based on a determination result of the bit flip sensor.

19 Claims, 15 Drawing Sheets

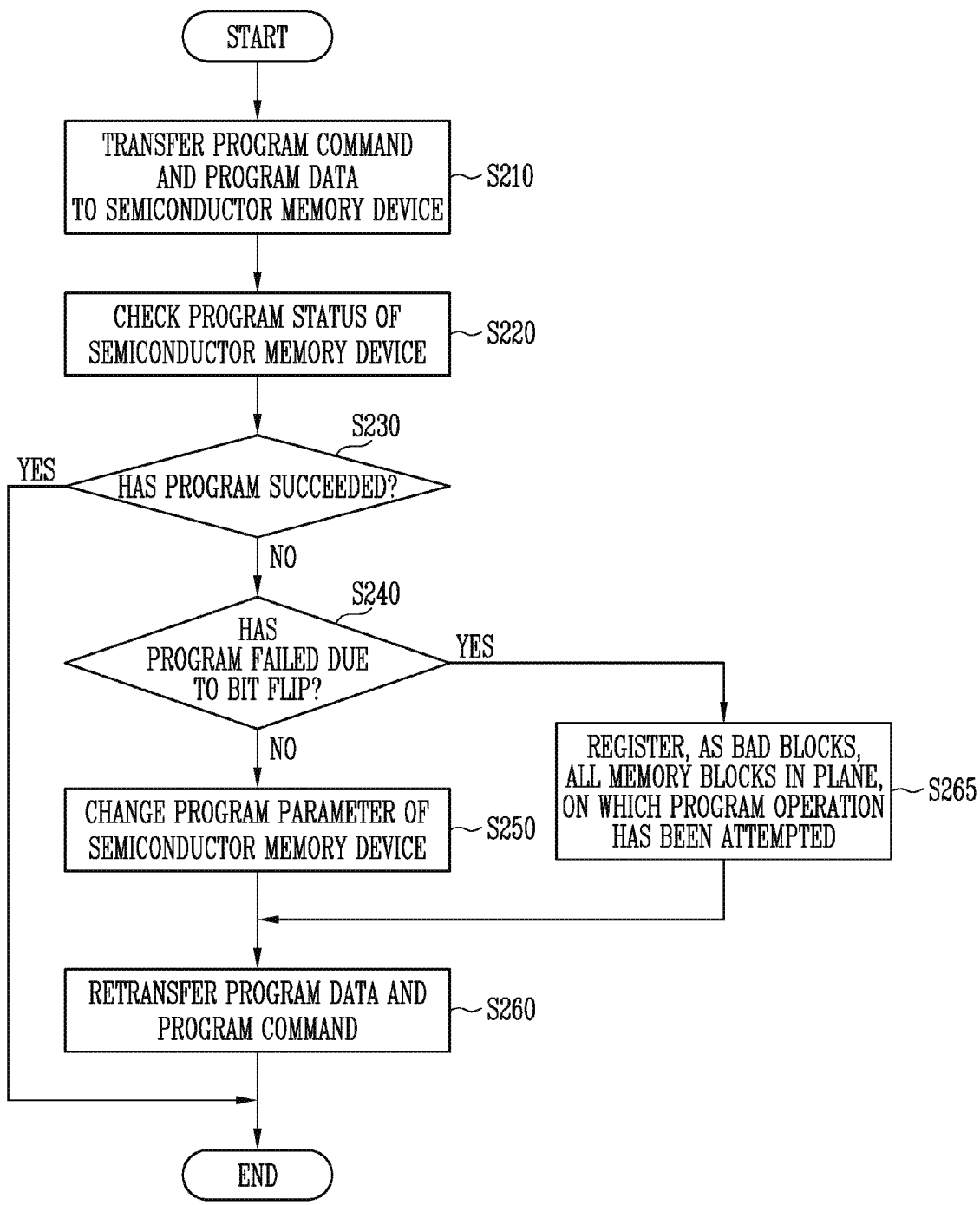

SEMICONDUCTOR MEMORY DEVICE, A CONTROLLER, AND OPERATING METHODS OF THE SEMICONDUCTOR MEMORY DEVICE AND THE CONTROLLER

CROSS-REFERENCE TO RELATED APPLICATION

The present application claims priority under 35 U.S.C. § 119(a) to Korean patent application number 10-2019-0168216, filed on Dec. 16, 2019, in the Korean Intellectual Property Office, the entire disclosure of which is incorporated herein by reference.

BACKGROUND

1. Technical Field

The present disclosure generally relates to an electronic device, and more particularly, to a semiconductor memory device, a controller, and operating methods of the semiconductor memory device and the controller.

2. Related Art

Semiconductor memory devices may be formed in a two-dimensional structure in which strings are arranged horizontally to a semiconductor substrate, or be formed in a three-dimensional structure in which strings are arranged vertically to a semiconductor substrate. A three-dimensional semiconductor memory device is a semiconductor memory device devised so as to overcome the limit of degree of integration in two-dimensional semiconductor memory devices, and may include a plurality of memory cells vertically stacked on a semiconductor substrate.

A controller may control an operation of the semiconductor memory device.

SUMMARY

In accordance with an aspect of the present disclosure, there is provided a semiconductor memory device including: a memory cell array including a plurality of memory cells; a read/write circuit configured to receive program data, and perform a program operation on selected memory cells among the plurality of memory cells, based on the program data; a bit flip sensor configured to receive the program data from the read/write circuit, and determine whether a bit flip has occurred in the program data; and control logic configured to control the program operation performed by the read/write circuit, and generate program status information, based on a determination result of the bit flip sensor.

The bit flip sensor may include: a bit counter configured to count a number of first bits having a first bit value among bits included in the program data; reference value storage configured to store at least one reference value for determining whether a bit flip has occurred in the program data; and a comparator configured to generate bit flip information representing whether a bit flip has occurred in the program data, by comparing the number of first bits with the at least one reference value.

The first bit value may be 1 included in the program data.
The first bit value may be 0 included in the program data.
The at least one reference value may include a first reference value and a second reference value greater than the first reference value. When the number of first bits is greater than the first reference value and is less than the second reference value, the comparator may be configured to generate the bit flip information representing that a bit flip has not occurred in the program data.

When the program operation based on the program data fails, the control logic may be configured to generate the program status information, representing a program fail regardless of whether a bit flip has occurred, based on the bit flip information.

The reference value may include a first reference value and a second reference value greater than the first reference value. When the number of first bits is less than or equal to the first reference value or when the number of first bits is greater than or equal to the second reference value, the comparator may be configured to generate the bit flip information representing that a bit flip has occurred in the program data.

The control logic may be configured to generate the program status information, representing that a program fail caused by a bit flip has occurred, based on the bit flip information.

In accordance with another aspect of the present disclosure, there is provided a method for operating a semiconductor memory device, the method including: receiving program data; determining whether a bit flip has occurred in the program data; and determining whether a program operation based on the program data has succeeded, based on the determination of whether a bit flip has occurred.

Determining whether a bit flip has occurred in the program data may include: counting a number of first bits having a first bit value included in the program data; comparing the number of first bits with at least one reference value; and determining whether a bit flip has occurred in the program data, based on the comparison result.

The reference value may include a first reference value and a second reference value greater than the first reference value. Determining whether or not a bit flip has occurred in the program data, based on the comparison result, may include determining that a bit flip has not occurred in the program data, when the number of first bits is greater than the first reference value and is less than the second reference value.

Determining whether a program operation based on the program data has succeeded based on the determination of whether a bit flip has occurred may include: starting the program operation; and determining whether the program operation has succeeded.

The reference value may include a first reference value and a second reference value greater than the first reference value. Determining whether a bit flip has occurred in the program data, based on the comparison result, may included determining that a bit flip has occurred in the program data, when the number of first bits is less than or equal to the first reference value or when the number of first bits is greater than or equal to the second reference value.

Determining whether or not the program operation based on the program data has succeeded based on the determination result may include determining that the program operation has failed when the number of first bits is less than or equal to the first reference value or when the number of first bits is greater than or equal to the second reference value.

In accordance with still another aspect of the present disclosure, there is provided a method for operating a controller for controlling a semiconductor memory device, the method including: transferring program data to the semiconductor memory device; checking a program status of the semiconductor memory device; and controlling a program operation of the semiconductor memory device, based on whether a bit flip has occurred in the program data, when the program operation of the semiconductor memory device fails.

Checking the program status of the semiconductor memory device may include determining whether a fail of the program operation is caused by a bit flip, by checking program status information received from the semiconductor memory device.

Controlling the program operation of the semiconductor memory device, based on whether a bit flip has occurred in the program data, when the program operation fails due to a bit flip, may include retransferring the program data to the semiconductor memory device.

Controlling the program operation of the semiconductor memory device, based on whether a bit flip has occurred in the program data, when the program operation fails due to a bit flip, may include: registering, as an invalid page, a physical page on which the program operation has been attempted; and retransferring the program data to the semiconductor memory device by changing a program address.

Controlling the program operation of the semiconductor memory device, based on whether a bit flip has occurred in the program data, when the program operation fails due to a bit flip, may include: registering, as bad blocks, all memory blocks in a plane, on which the program operation has been attempted; and retransferring the program data to the semiconductor memory device by changing a program address.

Controlling the program operation of the semiconductor memory device, based on whether a bit flip has occurred in the program data, when the program operation fails regardless of a bit flip, may include: changing a program parameter of the semiconductor memory device; and retransferring the program data to the semiconductor memory device.

BRIEF DESCRIPTION OF THE DRAWINGS

Example embodiments are described hereinafter with reference to the accompanying drawings; however, they may be embodied in different forms and should not be construed as limited to the embodiments set forth herein. Rather, these embodiments are provided so that this disclosure will be enabling to those skilled in the art.

In the drawings, dimensions may be exaggerated for clarity of illustration. It will be understood that when an element is referred to as being "between" two elements, it can be the only element between the two elements, or one or more intervening elements may also be present. Like reference numerals refer to like elements throughout.

FIG. 11B is a flowchart illustrating an operating method of the controller in accordance with another embodiment of the present disclosure.

DETAILED DESCRIPTION

Figure 1:
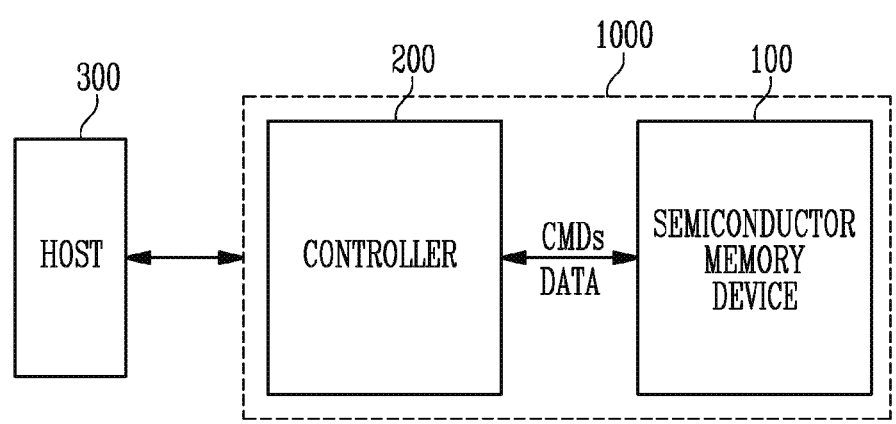
FIG. 1 is a block diagram illustrating a storage device including a controller in accordance with an embodiment of the present disclosure.

In the present disclosure, advantages, features and methods for achieving them will become more apparent after a reading of the following embodiments taken in conjunction with the drawings. The present disclosure may, however, be embodied in different forms and should not be construed as being limited to the embodiments set forth herein. Rather, these embodiments are provided to describe the present disclosure in detail to the extent that those skilled in the art to which the disclosure pertains may enforce the technical concept of the present disclosure.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Hereinafter, embodiments of the present disclosure will be described in detail with reference to the accompanying drawings. The same reference numerals are used to designate the same elements as those shown in other drawings. In the following descriptions, only portions necessary for understanding operations in accordance with the embodiments may be described, and descriptions of the other portions may be omitted so as to not obscure important concepts of the embodiments.

Some embodiments are directed to a semiconductor memory device, a controller, and operating methods thereof, which have improved operational reliability.

FIG. 1 is a block diagram illustrating a storage device 1000 including a controller 200 in accordance with an embodiment of the present disclosure.

Referring to FIG. 1, the storage device 1000 includes a semiconductor memory device 100 and the controller 200. Also, the storage device 1000 communicates with a host 300. The controller 200 controls a general operation of the semiconductor memory device 100 by transferring commands CMDs to the memory device 100, based on requests received from the host 300. Also, the controller 200 transfers data DATA corresponding to each of the commands CMDs to the semiconductor memory device 100, or receives data DATA corresponding to each of the commands CMDs from the semiconductor memory device 100. For example, when a program request and program data are received from the host 300, the controller 200 transfers a program command corresponding to the program request and the program data to the semiconductor memory device 100. In another example, when a read request is received from the host 300, the controller 200 transfers a read command corresponding to the read request to the semiconductor memory device 100. Subsequently, the semiconductor memory device 100 transfers read data corresponding to the read command to the controller 200.

For a program operation, program data is transferred from the controller 200 to the semiconductor memory device 100. The program data is stored in a page buffer of the semiconductor memory device 100. The page buffer may be included in a read/write circuit of the semiconductor memory device 100. The read/write circuit and the page buffer will be described later with reference to FIG. 2. Subsequently, memory cells included in the semiconductor memory device 100 are programmed based on the program data stored in the page buffer.

A bit flip may occur in a process of transferring the program data from the controller 200 to the page buffer or a process of storing the program data in the page buffer. A bit flip is a kind of data error, and means a phenomenon in which values of some of bits included in data are changed. In an example, when a bit flip occurs in the process of transferring the program data to the page buffer, data including an error is programmed in memory cells of the semiconductor memory device. In another example, when a bit flip occurs in the program data because a defect occurs in a page buffer circuit of the semiconductor memory device, data including an error is programmed in memory cells of the semiconductor memory device. The reliability of the semiconductor memory device and the storage including the same is problematic.

The controller 200 transfers a program command and program data corresponding thereto to the semiconductor memory device 100 so as to control a program operation of the semiconductor memory device 100. The semiconductor memory device 100 in accordance with the embodiment of the present disclosure determines whether a bit flip has occurred in the program data stored in the page buffer. In this process, the semiconductor memory device 100 may determine whether a bit flip has occurred in the received program data, based on whether a bit number of 1 s included in the corresponding program data is within a specific range.

The controller 200 may perform a data randomizing operation before the controller 200 transfers the program data to the semiconductor memory device 100. By the data randomizing operation, actual program data transferred to the semiconductor memory device 100 may be randomized data. A number of 1 s and a number of 0 s may be almost equally included in the randomized data. In an example, in the program data transferred to the semiconductor memory device 100, a number of 1 s may occupy about 50% of the total data.

However, when a transmission error caused by noise, etc. occurs in a process of transferring program data from the controller 200 to the semiconductor memory device 100 or when a defect exists in the page buffer circuit, a difference may occur between a bit number of 1 s and a bit number of 0 s in the program data stored in the page buffer of the semiconductor memory device 100. The bit number of 1 s included in the program data received by the semiconductor memory device 100 may be a value which is greater or less than 50% of the total data. When the bit number of 1 s included in the program data stored in the page buffer is not included in a certain range with respect to 50% of the total data, the semiconductor memory device 100 may determine that a bit flip has occurred in the corresponding program data. Meanwhile, when the bit number of 1 s included in the program data stored in the page buffer is included in the certain range with respect to 50% of the total data, the semiconductor memory device 100 may determine that a bit flip has not occurred in the corresponding program data.

When it is determined that a bit flip has not occurred in the program data, the semiconductor memory device 100 may store the received program data. When it is determined that a bit flip has occurred in the program data, the semiconductor memory device 100 may transfer, to the controller 200, information representing that a bit flip has occurred. The controller 200 may perform a subsequent operation, based on the information received from the semiconductor memory device 100.

For example, when a bit flip occurs in a data transmission process, the controller 200 may retransmit the same program data to the semiconductor memory device 100, and control the semiconductor memory device 100 to program the retransmitted data. Thus, the reliability of the semiconductor memory device 100 and the storage device 1000 including the same can be improved.

In another example, when a defect exists in the page buffer circuit, the controller 200 may register, as bad blocks, all memory blocks in a plane using the corresponding page buffer circuit. Additionally, the controller 200 may retransmit the program data to the semiconductor memory device 100 to program data in a memory block included in another plane of the semiconductor memory device 100.

In the semiconductor memory device 100 and the controller 200 in accordance with the embodiment of the present disclosure, a program error caused by a bit flip can be prevented. Accordingly, the operational reliability of the semiconductor memory device 100 and the storage device 1000 including the same can be improved.

Figure 2:
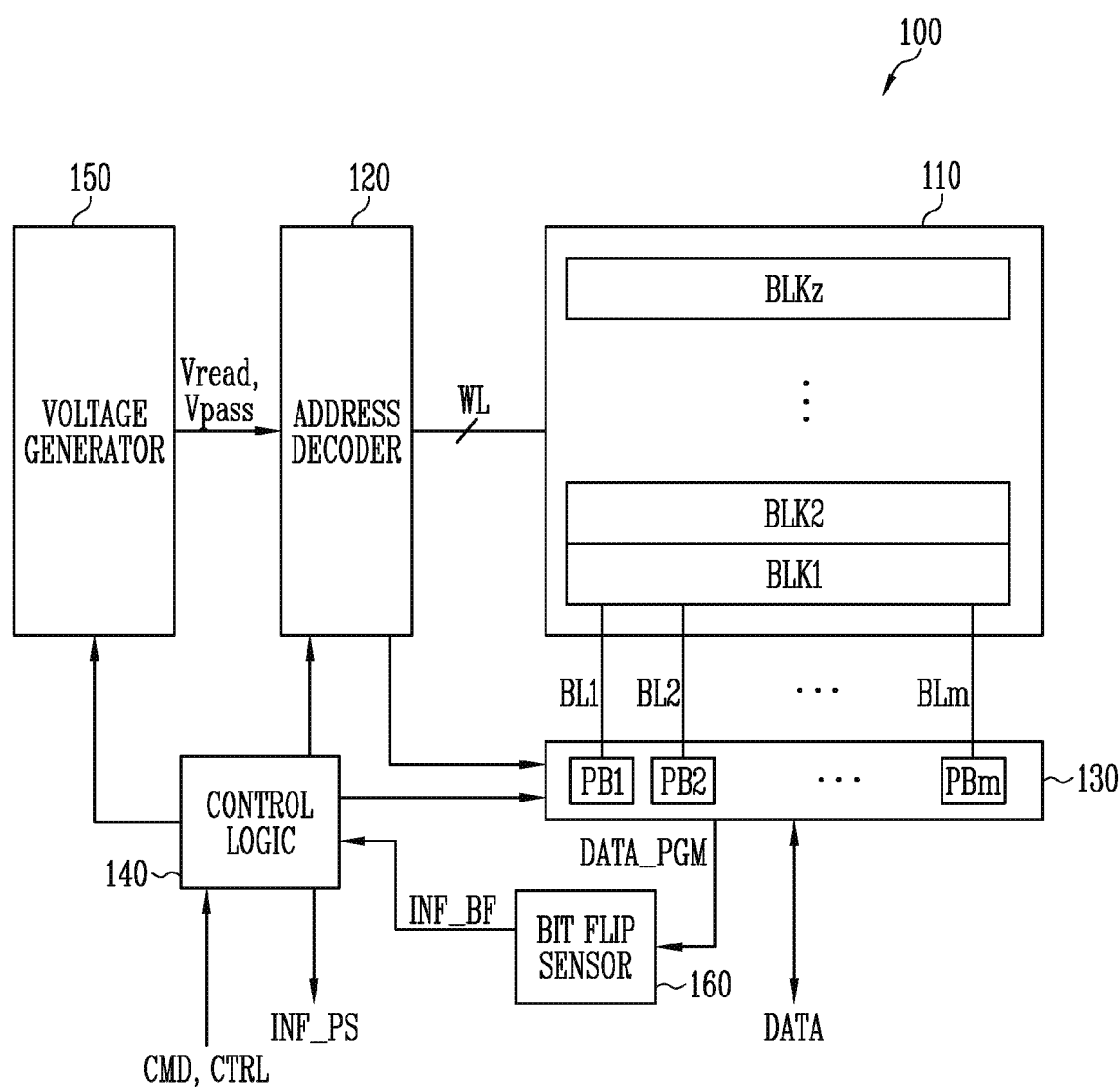
FIG. 2 is a block diagram illustrating a semiconductor memory device shown in FIG. 1.

FIG. 2 is a block diagram illustrating the semiconductor memory device 100 shown in FIG. 1.

Referring to FIG. 2, the semiconductor memory device 100 may include a memory cell array 110, an address decoder 120, a read/write circuit 130, control logic 140, a voltage generator 150, and a bit flip sensor 160.

The memory cell array 110 includes a plurality of memory blocks BLK1 to BLKz. The plurality of memory blocks BLK1 to BLKz are connected to the address decoder 120 through word lines WL. The plurality of memory blocks BLK1 to BLKz are connected to the read/write circuit 130 through bit lines BL1 to BLm. Each of the plurality of memory blocks BLK1 to BLKz includes a plurality of memory cells. In an embodiment, the plurality of memory cells may be nonvolatile memory cells, and be configured with nonvolatile memory cells having a vertical channel structure. The memory cell array 110 may be configured as a memory cell array having a two-dimensional structure. In some embodiments, the memory cell array 110 may be configured as a memory cell array having a three-dimensional structure. Meanwhile, each of the plurality of memory cells included in the memory cell array 110 may store at least 1-bit data. In an embodiment, each of plurality of the memory cells included in the memory cell array 110 may be a single-level cell (SLC) storing 1-bit data. In another embodiment, each of the plurality of memory cells included in the memory cell array 110 may be a multi-level cell (MLC) storing 2-bit data. In still another embodiment, each of the plurality of memory cells included in the memory cell array 110 may be a triple-level cell (TLC) storing 3-bit data. In still another embodiment, each of the plurality of memory cells included in the memory cell array 110 may be a quadruple-level cell (QLC) storing 4-bit data. In some embodiments, the memory cell array 110 may include a plurality of memory cells each storing 5-or-more bit data.

The address decoder 120, the read/write circuit 130, the control logic 140, and the voltage generator 150 operate as a peripheral circuit for driving the memory cell array 110. The address decoder 120 is connected to the memory cell array 110 through the word lines WL. The address decoder 120 operates under the control of the control logic 140. The address decoder 120 receives an address through an input/output buffer (not shown) in the semiconductor memory device 100.

The address decoder 120 decodes a block address among received addresses. The address decoder 120 selects at least one memory block according to the decoded block address. Also, in a read voltage application operation during a read operation, the address decoder 120 applies a read voltage Vread generated by the voltage generator 150 to a selected word line of the selected memory block, and applies a pass voltage Vpass generated by the voltage generator 150 to the other unselected word lines. Also, in a program verify operation, the address decoder 120 applies a verify voltage generated by the voltage generator 150 to the selected word line of the selected memory block, and applies the pass voltage Vpass to the other unselected word lines.

The address decoder 120 decodes a column address among the received addresses. The address decoder 120 transmits the decoded column address to the read/write circuit 130.

Read and program operations of the semiconductor memory device 100 are performed in a unit of a page. Addresses received in a request for the read and program operations include a block address, a row address, and a column address. The address decoder 120 selects one memory block and one word line according to the block address and the row address. The column address is decoded by the address decoder 120 to be provided to the read/write circuit 130.

The address decoder 120 may include a block decoder, a row decoder, a column decoder, an address buffer, and the like.

The read/write circuit 130 includes a plurality of page buffers PB1 to PBm. The read/write circuit 130 may operate as a "read circuit" in a read operation, and operate as a "write circuit" in a write operation. The plurality of page buffers PB1 to PBm are connected to the memory cell array 110 through the bit lines BL1 to BLm. In order to sense threshold voltages of the memory cells in a read operation or a program verify operation, the plurality of page buffers PB1 to PBm supply sensing current to the bit lines connected to the memory cells, and each page buffer senses, through a sensing node, a change in amount of current flowing depending on a program state of a corresponding memory cell and then latches the sensed change as sensing data. The read/write circuit 130 operates in response to page buffer control signals output from the control logic 140.

In a read operation, the read/write circuit 130 senses data of the memory cells and temporarily stores read data, and then outputs data DATA to the input/output buffer (not shown) of the semiconductor memory device 100. In an embodiment, the read/write circuit 130 may include a column select circuit and the like as well as the page buffers (or page registers).

The control logic 140 is connected to the address decoder 120, the read/write circuit 130, and the voltage generator 150. The control logic 140 receives a command CMD and a control signal CTRL though the input/output buffer (not shown) of the semiconductor memory device 100. The control logic 140 controls a general operation of the semiconductor memory device 100 in response to the control signal CTRL. Also, the control logic 140 outputs a control signal for adjusting a sensing node precharge potential levels of the plurality of page buffers PB1 to PBm. The control logic 140 may control the read/write circuit 130 to perform a read operation of the memory cell array 110. The control logic 140 may be implemented as hardware, software, or a combination of hardware and software. For example, the control logic 140 may be a control logic circuit operating in accordance with an algorithm and/or a processor executing control logic code.

The voltage generator 150 generates a read voltage Vread and a pass voltage Vpass in a read operation in response to a control signal output from the control logic 140. In order to generate a plurality of voltages having various voltage levels, the voltage generator 150 may include a plurality of pumping capacitors for receiving an internal power voltage, and generate the plurality of voltages by selectively activating the plurality of pumping capacitors under the control of the control logic 140. As described above, the voltage generator 150 may include a charge pump, and the charge pump may include the plurality of pumping capacitors described above. A detailed configuration of the charge pump included in the voltage generator 150 may be variously designed, if necessary.

The bit flip sensor 160 may receive program data DATA_PGM stored in the read/write circuit 130, and determine whether a bit flip has occurred in the program data DATA_PGM. As a determination result, the bit flip sensor 160 transfers, to the control logic 140, bit flip information INF_BF representing whether a bit flip has occurred in the program data DATA_PGM.

The program data DATA_PGM may mean program data transferred from the controller 200 among data transferred to the read/write circuit 130.

The address decoder 120, the read/write circuit 130, and the voltage generator 150 may serve as a "peripheral circuit" for performing a read operation, a write operation, and an erase operation on the memory cell array 110. The peripheral circuit performs the read operation, the write operation, and the erase operation on the memory cell array 110 under the control of the control logic 140.

The control logic 140 may transfer, to the controller 200, program status information INF_PS representing a status of a program operation of the semiconductor memory device 100. The program status information INF_PS may include information representing whether a program operation corresponding to a program command received from the controller 200 has succeeded or failed. When the program operation fails, the program status information INF_PS may include information representing whether the fail of the corresponding program is a fail caused by a bit flip or a general program fail irrelevant to a bit flip. The program status information INF_PS may additionally include a data field representing whether a bit flip has occurred, in addition to a data field representing whether the program operation has failed.

In an example, when the bit flip information INF_BF transferred from the bit flip sensor 160 to the control logic 140 represents that a bit flip has occurred in the program data DATA_PGM, the control logic 140 may transfer, to the controller 200, the program status information INF_PS representing that the program operation has failed due to a bit flip.

In another example, when the bit flip information INF_BF transferred from the bit flip sensor 160 to the control logic 140 represents that a bit flip has not occurred in the program data DATA_PGM, a general program fail may occur. For example, when a verify result represents that program operation is not completed even though a maximum program pulse is applied to a selected program page, a program operation may be ended, and it is determined that the corresponding program operation has failed. In the case of the general program fail, the control logic 140 may transfer, to the controller 200, the program status information INF_PS representing the general program fail instead of the program fail caused by a bit flip.

A more detailed embodiment of the bit flip sensor 160 will be described later with reference to FIG. 9.

Figure 3:
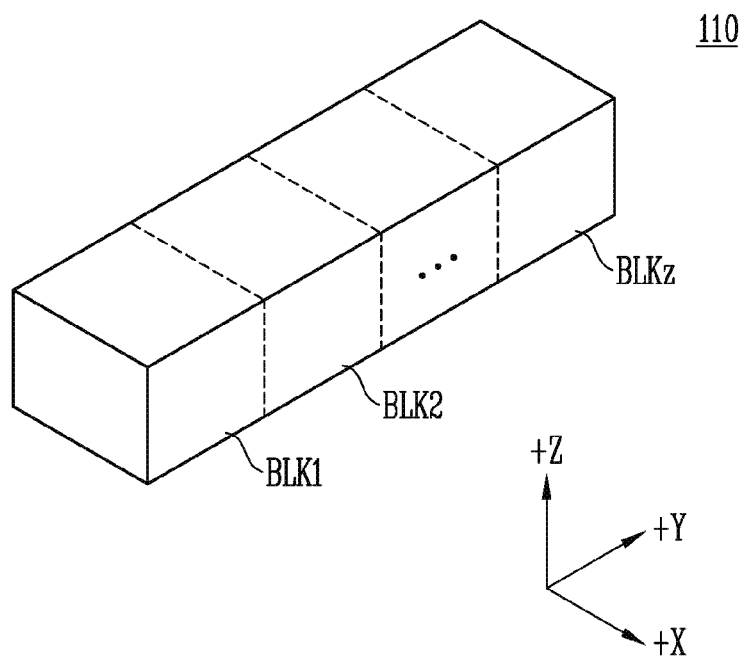
FIG. 3 is a diagram illustrating an embodiment of a memory cell array shown in FIG. 2.

FIG. 3 is a diagram illustrating an embodiment of the memory cell array 110 shown in FIG. 2.

Referring to FIG. 3, the memory cell array 110 may include a plurality of memory blocks BLK1 to BLKz. Each memory block may have a three-dimensional structure. Each memory block may include a plurality of memory cells stacked on a substrate (not shown). The plurality of memory cells may be arranged along +X, +Y, and +Z directions. A structure of each memory block will be described in more detail with reference to FIGS. 4 and 5.

Figure 4:
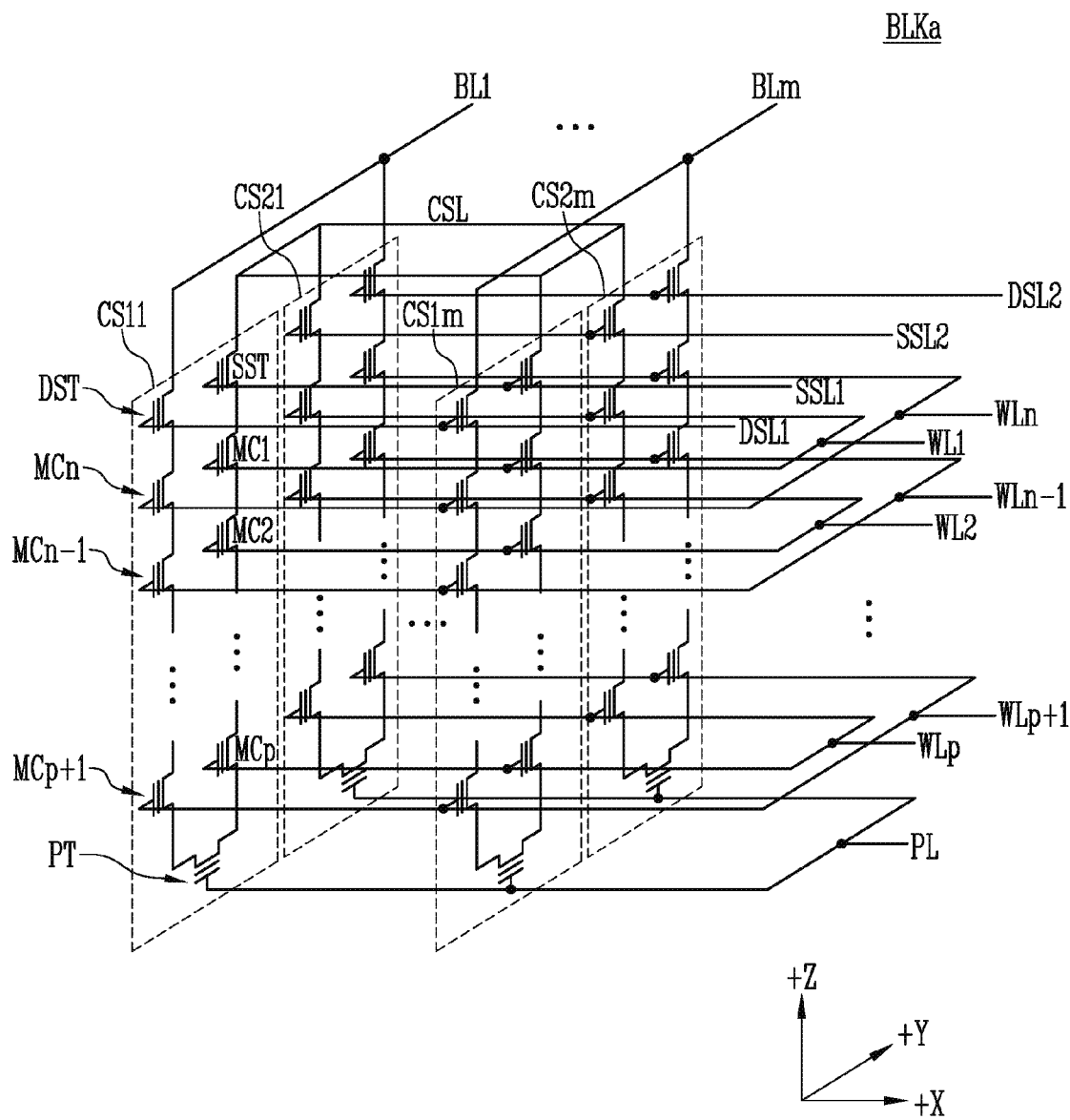
FIG. 4 is a circuit diagram illustrating a memory block among memory blocks shown in FIG. 3.

FIG. 4 is a circuit diagram illustrating any one memory block BLKa among the memory blocks BLK1 to BLKz shown in FIG. 3.

Referring to FIG. 4, the memory block BLKa may include a plurality of cell strings CS11 to CS1m and CS21 to CS2m. In an embodiment, each of the plurality of cell strings CS11 to CS1m and CS21 to CS2m may be formed in a 'U' shape. In the memory block BLKa, m cell strings are arranged in a row direction (i.e., a +X direction). FIG. 4 illustrates two cell strings arranged in a column direction (i.e., a +Y direction). However, this is for convenience of description, and it will be understood that three cell strings may be arranged in the column direction.

Each of the plurality of cell strings CS11 to CS1m and CS21 to CS2m may include at least one source select transistor SST, first to nth memory cells MC1 to MCn, a pipe transistor PT, and at least one drain select transistor DST.

Select transistors SST and DST and the memory cells MC1 to MCn may have structures similar to one another. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and memory cells MC1 to MCp.

In an embodiment, the source select transistors of cell strings arranged on the same row are connected to a source select line extending in the row direction, and the source select transistors of cell strings arranged on different rows are connected to different source select lines. In FIG. 4, the source select transistors of the cell strings CS11 to CS1m on a first row are connected to a first source select line SSL1. The source select transistors of the cell strings CS21 to CS2m on a second row are connected to a second source select line SSL2.

In another embodiment, the source select transistors of the cell strings CS11 to CS1m and CS21 to CS2m may be commonly connected to one source select line.

The first to nth memory cells MC1 to MCn of each cell string are connected between the source select transistor SST and the drain select transistor DST.

The first to nth memory cells MC1 to MCn may be divided into first to pth memory cells MC1 to MCp and a (p+1)th to nth memory cells MCp+1 to MCn. The first to pth memory cells MC1 to MCp are sequentially arranged in the opposite direction of a +Z direction, and are connected in series between the source select transistor SST and the pipe transistor PT. The (p+1)th to nth memory cells MCp+1 to MCn are sequentially arranged in the +Z direction, and are connected in series between the pipe transistor PT and the drain select transistor DST. The first to pth memory cells MC1 to MCp and the (p+1)th to nth memory cells MCp+1 to MCn are connected through the pipe transistor PT. Gate electrodes of the first to nth memory cells MC1 to MCn of each cell string are connected to first to nth word lines WL1 to WLn, respectively.

A gate of the pipe transistor PT of each cell string is connected to a pipe line PL.

The drain select transistor DST of each cell string is connected between a corresponding bit line and the memory cells MCp+1 to MCn. The drain select transistors DST of cell strings arranged in the row direction are connected to a drain select line extending in the row direction. The drain select transistors of the cell strings CS11 to CS1m on the first row are connected to a first drain select line DSL1. The drain select transistors of the cell strings CS21 to CS2m on the second row are connected to a second drain select line DSL2.

The drain select transistors DST of cell strings arranged in the column direction are connected to a bit line extending in the column direction. In FIG. 4, the drain select transistors DST of cell strings CS11 and CS21 on a first column are connected to a first bit line BL1. The drain select transistors DST of the cell strings CS1m and CS2m on an mth column are connected to an mth bit line BLm.

Memory cells connected to the same word line in the cell strings arranged in the row direction constitute one page. For example, memory cells connected to the first word line WL1 in the cell strings CS11 to CS1m on the first row constitute one page. Memory cells connected to the first word line WL1 in the cell strings CS21 to CS2m on the second row constitute another page. As any one of the drain select lines DSL1 and DSL2 is selected, cell strings arranged in one row direction may be selected. As any one of the word lines WL1 to WLn is selected, one page may be selected in the selected cell strings.

In another embodiment, even bit lines and odd bit lines may be provided instead of the first to mth bit lines BL1 to BLm. In addition, even-numbered cell strings among the cell strings CS11 to CS1m or CS21 to CS2m arranged in the row direction may be connected to the even bit lines, respectively, and odd-numbered cell strings among the cell strings CS11 to CS1m or CS21 to CS2m arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the memory cells MC1 to MCp. Alternatively, the at least one dummy memory cell may be provided to decrease an electric field between the drain select transistor DST and the memory cells MCp+1 to MCn. When the number of dummy memory cells increases, the reliability of an operation of the memory block BLKa is improved. On the other hand, the size of the memory block BLKa increases. When the number of dummy memory cells decreases, the size of the memory block BLKa decreases. On the other hand, the reliability of an operation of the memory block BLKa may be deteriorated.

In order to efficiently control the at least one dummy memory cell, the dummy memory cells may have a required threshold voltage. Before or after an erase operation of the memory block BLKa, a program operation may be performed on all or some of the dummy memory cells. When an erase operation is performed after the program operation is performed, the dummy memory cells can have the required threshold voltage by controlling a voltage applied to the dummy word lines connected to the respective dummy memory cells.

Figure 5:
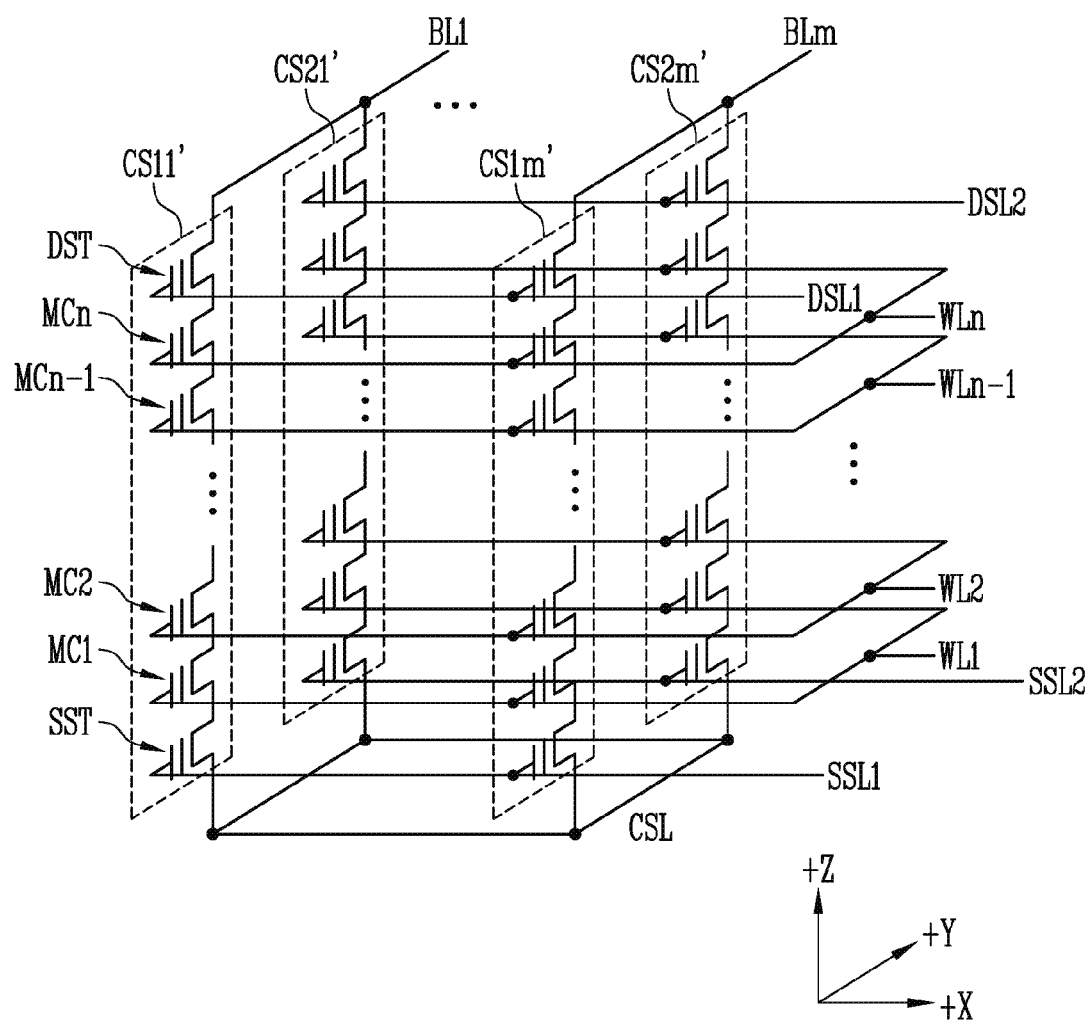
FIG. 5 is a circuit diagram illustrating another embodiment of a memory block among the memory blocks shown in FIG. 3.

FIG. 5 is a circuit diagram illustrating another embodiment BLKb of the one memory block among the memory blocks BLK1 to BLKz shown in FIG. 3.

Referring to FIG. 5, the memory block BLKb may include a plurality of cell strings CS11' to CS1m' and CS21' to CS2m'. Each of the plurality of cell strings CS11' to CS1m' and CS21' to CS2m' extends along the +Z direction. Each of the plurality of cell strings CS11' to CS1m' and CS21' to CS2m' includes at least one source select transistor SST, first to nth memory cells MC1 to MCn, and at least one drain select transistor DST, which are stacked on a substrate (not shown) under the memory block BLKb.

The source select transistor SST of each cell string is connected between a common source line CSL and the memory cells MC1 to MCn. The source select transistors of cell strings arranged on the same row are connected to the same source select line. The source select transistors of the cell strings CS11' to CS1m' arranged on a first row are connected to a first source select line SSL1. Source select transistors of the cell strings CS21' to CS2m' arranged on a second row are connected to a second source select line SSL2. In another embodiment, the source select transistors of the cell strings CS11' to CS1m' and CS21' to CS2m' may be commonly connected to one source select line.

The first to nth memory cells MC1 to MCn of each cell string are connected in series between the source select transistor SST and the drain select transistor DST. Gate electrodes of the first to nth memory cells MC1 to MCn are connected to first to nth word lines WL1 to WLn, respectively.

The drain select transistor DST of each cell string is connected between a corresponding bit line and the memory cells MC1 to MCn. The drain select transistors of cell strings arranged in the row direction are connected to a drain select line extending in the row direction. The drain select transistors of the cell strings CS11' to CS1m' on the first row are connected to a first drain select line DSL1. The drain select transistors of the cell strings CS21' to CS2m' on the second row are connected to a second drain select line DSL2.

Consequently, the memory block BLKb of FIG. 5 has a circuit similar to that of the memory block BLKa of FIG. 4, except that the pipe transistor PT is excluded from each cell string in FIG. 5.

In another embodiment, even bit lines and odd bit lines may be provided instead of the first to mth bit lines BL1 to BLm. In addition, even-numbered cell strings among the cell strings CS11' to CS1m' or CS21' to CS2m' arranged in the row direction may be connected to the even bit lines, respectively, and odd-numbered cell strings among the cell strings CS11' to CS1m' or CS21' to CS2m' arranged in the row direction may be connected to the odd bit lines, respectively.

In an embodiment, at least one of the first to nth memory cells MC1 to MCn may be used as a dummy memory cell. For example, the at least one dummy memory cell may be provided to decrease an electric field between the source select transistor SST and the non-dummy memory cells. Alternatively, the at least one dummy memory cell may be provided to decrease an electric field between the drain select transistor DST and the non-dummy memory cells. When the number of dummy memory cells increases, the reliability of an operation of the memory block BLKb is improved. On the other hand, the size of the memory block BLKb is increased. When the number of dummy memory cells decreases, the size of the memory block BLKb decreases. On the other hand, the reliability of an operation of the memory block BLKb may be deteriorated.

In order to efficiently control the at least one dummy memory cell, the dummy memory cells may have a required threshold voltage. Before or after an erase operation of the memory block BLKb, a program operation may be performed on all or some of the dummy memory cells. When an erase operation is performed after the program operation is performed, the threshold voltage of the dummy memory cells control a voltage applied to the dummy word lines connected to the respective dummy memory cells, so that the dummy memory cells can have the required threshold voltage.

Figure 6:
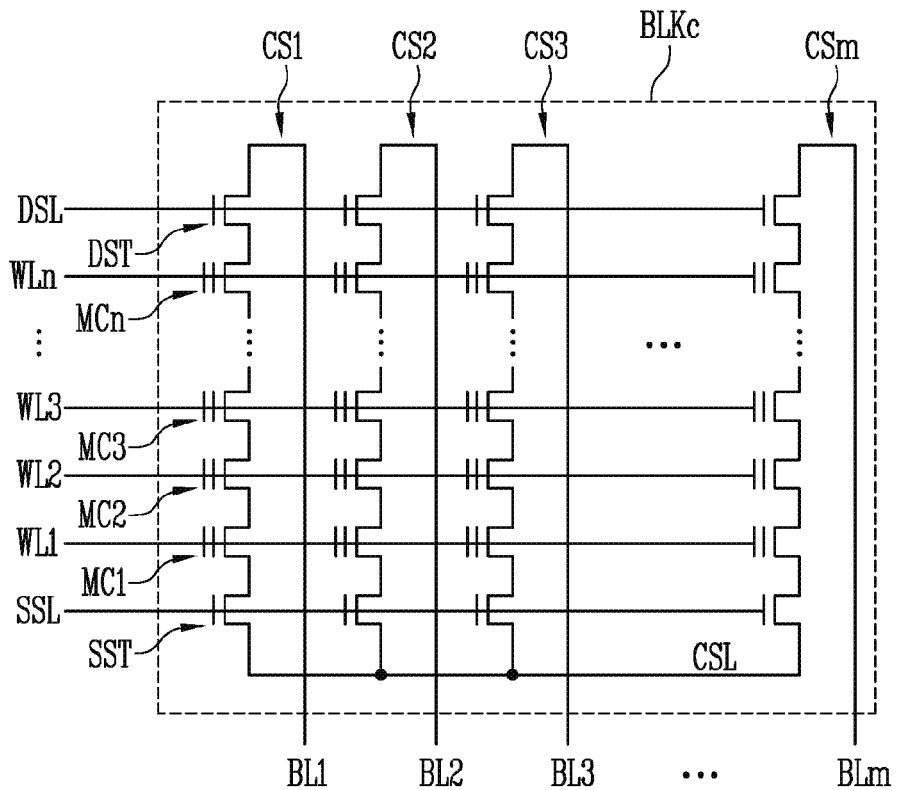
FIG. 6 is a circuit diagram illustrating an embodiment of a memory block among a plurality of memory blocks included in the memory cell array shown in FIG. 2.

FIG. 6 is a circuit diagram illustrating an embodiment of any one memory block BLKc among the plurality of memory blocks BLK1 to BLKz included in the memory cell array 110 shown in FIG. 2.

Referring to FIG. 6, the memory block BLKc includes a plurality of strings CS1 to CSm. The plurality of strings CS1 to CSm may be connected to a plurality of bit lines BL1 to BLm, respectively. Each of the plurality of strings CS1 to CSm includes at least one source select transistor SST, first to nth memory cells MC1 to MCn, and at least one drain select transistor DST.

Each of the select transistors SST and DST and the memory cells MC1 to MCn may have a similar structure. In an embodiment, each of the select transistors SST and DST and the memory cells MC1 to MCn may include a channel layer, a tunneling insulating layer, a charge storage layer, and a blocking insulating layer. In an embodiment, a pillar for providing the channel layer may be provided in each cell string. In an embodiment, a pillar for providing at least one of the channel layer, the tunneling insulating layer, the charge storage layer, and the blocking insulating layer may be provided in each cell string.

The source select transistor SST of each cell string is connected between a common source line CSL and the memory cells MC1 to MCn.

The first to nth memory cells MC1 to MCn of each cell string is connected between the source select transistor SST and the drain select transistor DST.

The drain select transistor DST of each cell string is connected between a corresponding bit line and the memory cells MC1 to MCn.

Memory cells connected to the same word line constitute one page. As a drain select line DSL is selected, the cell strings CS1 to CSm may be selected. As any one of word lines WL1 to WLn is selected, one page among selected cell strings may be selected.

In another embodiment, even bit lines and odd bit lines may be provided instead of the first to mth bit lines BL1 to BLm. Even-numbered cell strings among the cell strings CS1 to CSm arranged may be connected to the even bit lines, respectively, and odd-numbered cell strings among the cell strings CS1 to CSm may be connected to the odd bit lines, respectively.

Figure 7:
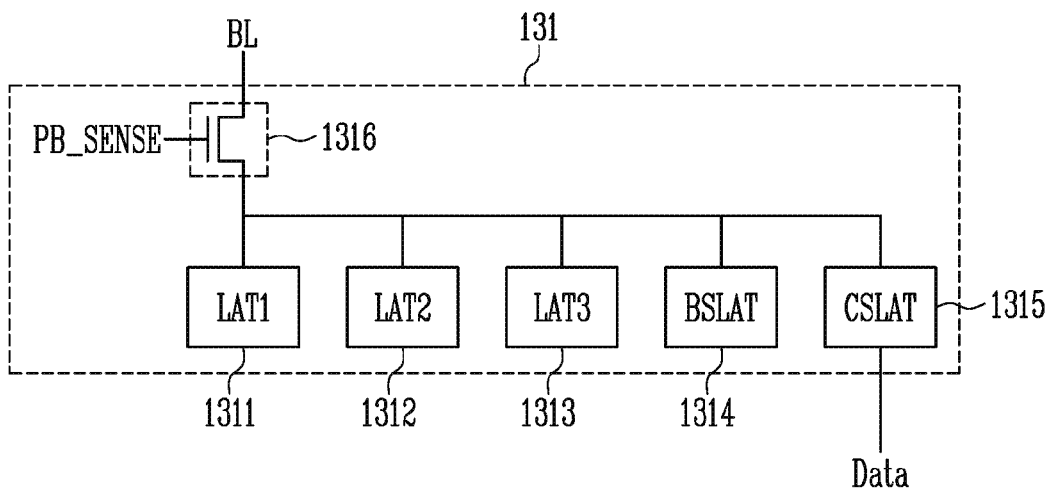
FIG. 7 is a diagram schematically illustrating a page buffer in accordance with an embodiment of the present disclosure.

FIG. 7 is a diagram schematically illustrating a page buffer 131 in accordance with an embodiment of the present disclosure.

In a read or program verify operation, data stored in a memory cell or a threshold voltage of the memory cell is sensed through a bit line BL. The page buffer 131 may include a bit line sense latch BSLAT 1314 for storing such a sensing result. Also, the bit line sense latch 1314 may be used to determine a program allow voltage or a program inhibit voltage, which is applied to the bit line BL, in a program execution operation.

The page buffer 131 may include a plurality of data latches 1311, 1312, and 1313 for storing program data Data input from the outside in a program operation. For example, in the embodiment shown in FIG. 6, the page buffer 131 may store 3-bit data. A data latch LAT1 1311 may store a most significant bit (MSB), a data latch LAT2 1312 may store a central significant bit (CSB), and a data latch LAT3 1313 may store a least significant bit (LSB). The data latches 1311, 1312, and 1313 may maintain the stored program data, until the memory cell is completely programmed.

Meanwhile, the page buffer 131 may include a bit line connection transistor 1316 which controls connection of the bit line BL to the bit line sense latch 1314, the data latches 1311, 1312, and 1313 and a cache latch 1315. The bit line connection transistor 1316 is controlled by a bit line connection signal PB_SENSE. For example, when data is read from the memory cell, the bit line connection transistor 1316 may be turned on to electrically connect the bit line BL and the bit line sense latch 1314. Also, the bit line connection transistor 1316 may be turned off when data stored in the bit line sense latch 1314 is transmitted to the cache latch 1315.

Figure 8:
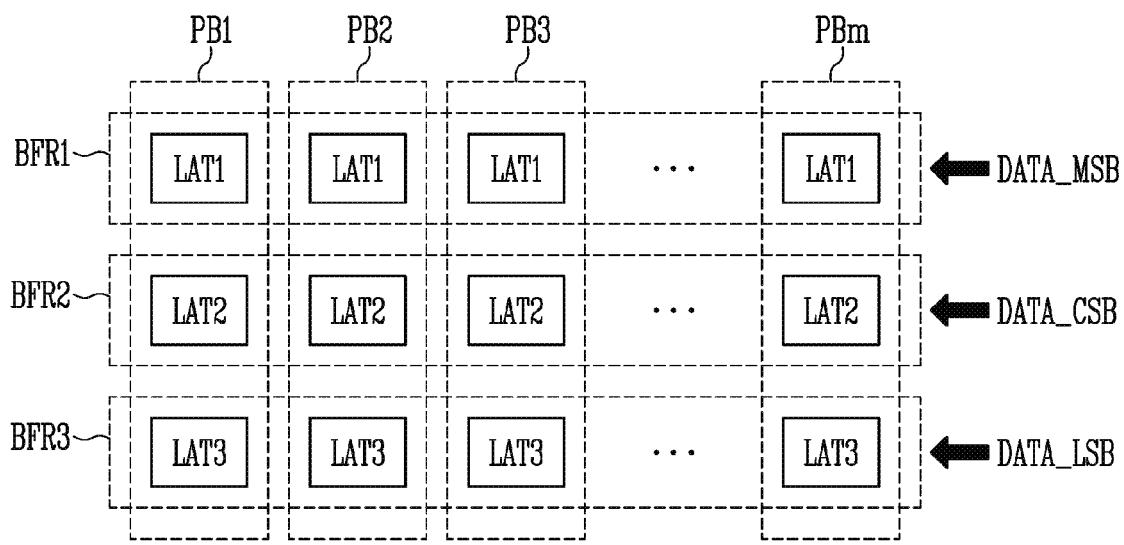
FIG. 8 is a diagram illustrating data stored in a plurality of page buffers.

FIG. 8 is a diagram illustrating data stored in a plurality of page buffers.

Referring to FIG. 8, the read/write circuit 130 may include first to mth page buffers PB1 to PBm. As described with reference to FIG. 7, each page buffer may include a plurality of data latches 1311, 1312, and 1313. As described above, a data latch LAT1 1311 may store a most significant bit (MSB), a data latch LAT2 1312 may store a central significant bit (CSB), and a data latch LAT3 1313 may store a least significant bit (LSB).

Data latches LAT1 among the data latches included in the first to mth page buffers PB1 to PBm of the read/write circuit 130 may constitute a first buffer BFR1. Most significant bit page data DATA_MSB may be stored in the first buffer BFR1. The most significant bit page data DATA_MSB may include m data bits. The m data bits of the most significant bit page data DATA_MSB may be most significant bits respectively stored in memory cells included in a selected physical page.

Data latches LAT2 among the data latches included in the first to mth page buffers PB1 to PBm of the read/write circuit 130 may constitute a second buffer BFR2. Central significant bit page data DATA_CSB may be stored in the second buffer BFR2. The central significant bit page data DATA_CSB may include m data bits. The m data bits of the central significant bit page data DATA_CSB may be central significant bits respectively stored in the memory cells included in the selected physical page.

Data latches LAT3 among the data latches included in the first to mth page buffers PB1 to PBm of the read/write circuit 130 may constitute a third buffer BFR3. Least significant bit page data DATA_LSB may be stored in the third buffer BFR3. The least significant bit page data DATA_LSB may include m data bits. The m data bits of the least significant bit page data DATA_LSB may be least significant bits respectively stored in the memory cells included in the selected physical page.

The bit flip sensor 160 of the semiconductor memory device 100 in accordance with the embodiment of the present disclosure may determine whether a bit flip has occurred in at least one data among a plurality of page data stored in the read/write circuit 130. For example, the bit flip sensor 160 may determine whether a bit flip has occurred in the least significant bit page data DATA_LSB stored in the third buffer BFR3. Hereinafter, the bit flip sensor 160 which determines whether a bit flip has occurred in the least significant bit page data DATA_LSB will be described in FIG. 9.

Figure 9:
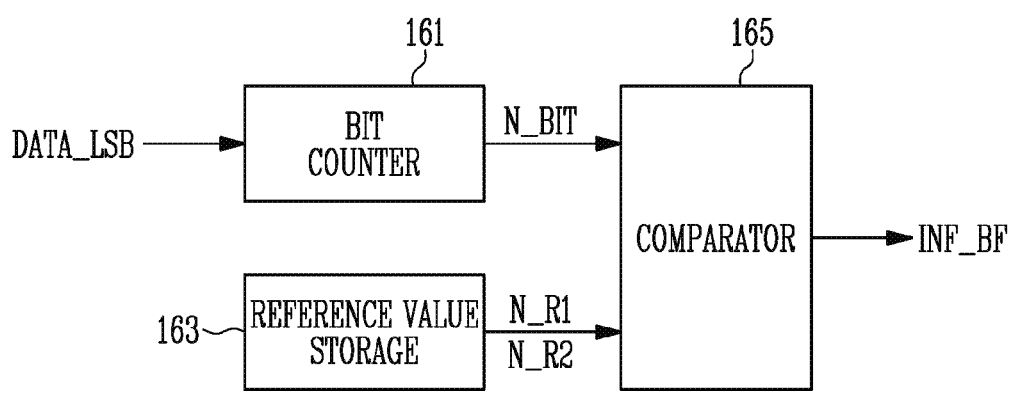
FIG. 9 is a block diagram illustrating an embodiment of a bit flip sensor shown in FIG. 2.

FIG. 9 is a block diagram illustrating an embodiment of the bit flip sensor 160 shown in FIG. 2.

Referring to FIG. 9, the bit flip sensor 160 may include a bit counter 161, reference value storage 163, and a comparator 165.

The bit counter 161 of the bit flip sensor 160 may receive least significant bit page data DATA_LSB from the read/write circuit 130. Although a case where the least significant bit page data DATA_LSB is received is illustrated in the example shown in FIG. 9, the bit flip sensor 160 in accordance with the present disclosure may also receive most significant bit page data DATA_MSB or central significant bit page data DATA_CSB to determine whether a bit flip has occurred in the corresponding data.

The bit counter 161 may count a bit number N_BIT of 1 s included in the received least significant bit page data DATA_LSB. The bit counter 161 may generate the counted bit number N_BIT of 1 s and transfer the bit number N_BIT of 1 s to the comparator 165. In another embodiment, the bit counter 161 may count a bit number of 0s included in the received least significant bit page data DATA_LSB and transfer the bit number of 0s to the comparator 165.

The reference value storage 163 may store reference values for determining whether a bit flip has occurred. In an embodiment, the reference value storage 163 may store a first reference value N_R1 and a second reference value N_R2. In an embodiment, each of the first reference value N_R1 and the second reference value N_R2 may be a natural number. Meanwhile, in an embodiment, the first reference value N_R1 may be a value less than the second reference value N_R2. Also, in an embodiment, the first reference value N_R1 may be a value less than m/2 which is half of a total number of bits m included in the least significant bit page data DATA_LSB. Meanwhile, the second reference value N_R2 may be a value greater than m/2 which is half of the total bit number of bits included in the least significant bit page data DATA_LSB. The first reference value N_R1 and the second reference value N_R2 may be variously determined according to the total bit number of bits included in the least significant bit page data DATA_LSB or according to another design condition, etc.

The comparator 165 may receive the bit number N_BIT of 1 s from the bit counter 161, and receive the first reference value N_R1 and the second reference value N_R2 from the reference value storage 163. Meanwhile, the comparator 165 may determine whether a bit flip has occurred by comparing the bit number N_BIT of 1 s with each of the first reference value N_R1 and the second reference value N_R2.

For example, when the bit number N_BIT of 1 s is greater than the first reference value N_R1 and is less than the second reference value N_R2, the comparator 165 may determine that a bit flip has not occurred in the least significant bit page data DATA_LSB. Meanwhile, when the bit number N_BIT of 1 s is less than or equal to the first reference value N_R1 or when the bit number N_BIT of 1 s is greater than or equal to the second reference value N_R2, the comparator 165 may determine that a bit flip has occurred in the least significant bit page data DATA_LSB.

The comparator 165 may generate bit flip information INF_BF, based on a determination result. The bit flip information INF_BF may include information representing whether a bit flip has occurred in the least significant bit page data DATA_LSB.

Figure 10:
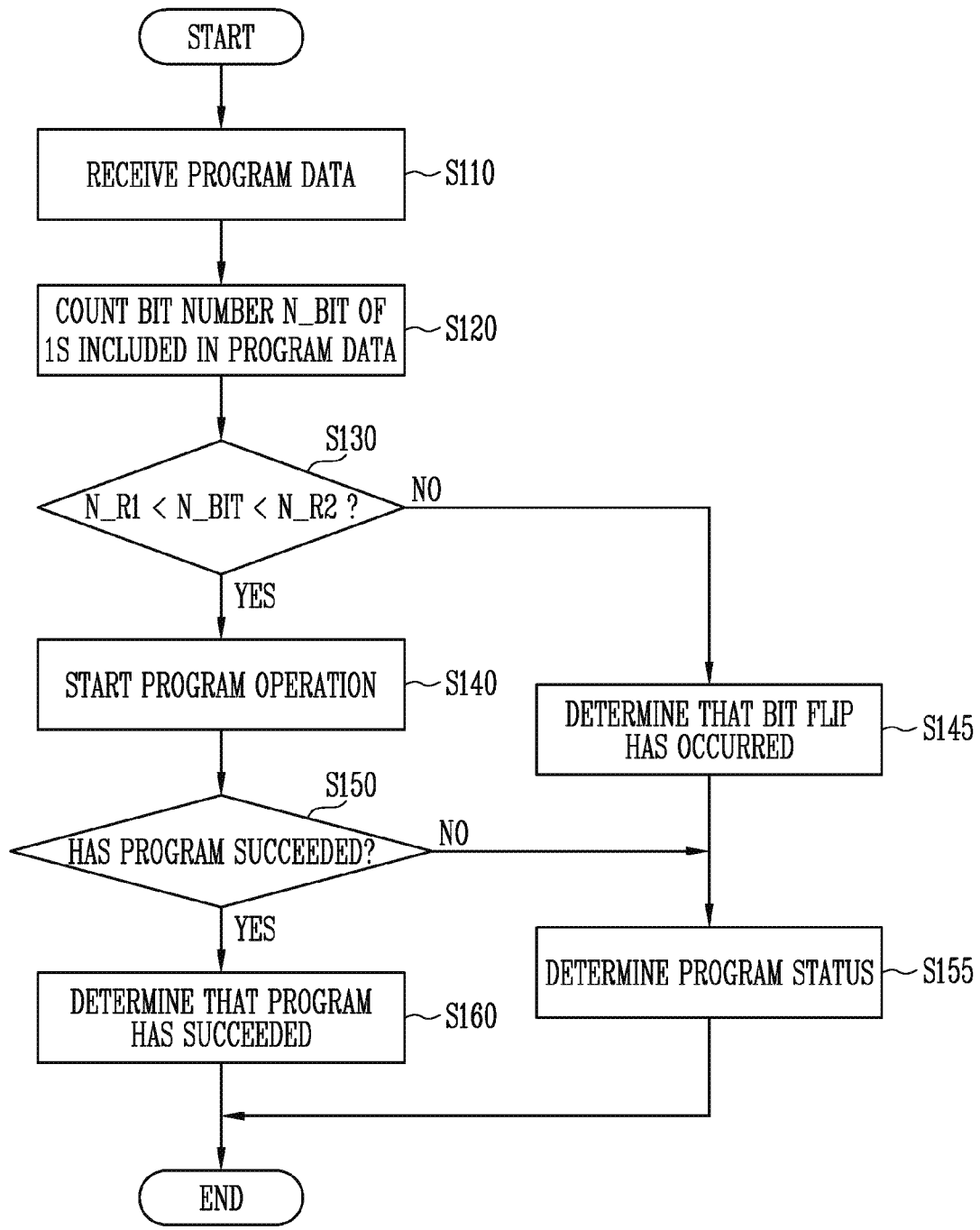
FIG. 10 is a flowchart illustrating an operating method of the semiconductor memory device in accordance with an embodiment of the present disclosure.

FIG. 10 is a flowchart illustrating an operating method of the semiconductor memory device 100 in accordance with an embodiment of the present disclosure.

Referring to FIG. 10, in step S110, the semiconductor memory device 100 may receive program data from the controller 200. The received program data may be stored in the first to third buffer BFR1 to BFR3 included in the read/write circuit 130.

In step S120, the bit counter 161 of the bit flip sensor 160 counts a bit number N_BIT of 1 s included in the program data. In the step S120, the program data may be any one of the most significant bit page data DATA_MSB, the central significant bit page data DATA_CSB, and the least significant bit page data DATA_LSB, which are shown in FIG. 8.

In step S130, the comparator 165 of the bit flip sensor 160 determines whether the bit number N_BIT of 1 s is greater than a first reference value N_R1 and is less than a second reference value N_R2. That is, the comparator 165 determines whether the counted bit number N_BIT of 1 s is included in a certain range set by the first reference value N_R1 and the second reference value N_R2.

When the bit number N_BIT of 1 s included in the program data is greater than the first reference value N_R1 and is less than the second reference value N_R2 (S130) (Yes), it may be determined that any bit flip has not occurred. Accordingly, a program operation based on the received program data may be started (S140). In the step S140, the control logic 140 controls the read/write circuit 130 and other peripheral circuits to start an operation of programming the program data to selected memory cells in the memory cell array.

In step S150, it is determined whether a program has succeeded. When the program succeeds (S150) (Yes), it is determined that the program has succeeded (S160). In the step S160, the control logic 140 may generate program status information INF_PS representing that the program has succeeded, and transfer the program status information INF_PS to the controller 200.

When the program fails (S150) (No), it is determined that the program has failed (S155). In the step S155, the control logic 140 may generate program status information INF_PS representing that the program has failed, and transfer the program status information INF_PS to the controller 200.

When the bit number N_BIT of 1 s included in the program data is less than or equal to the first reference value N_R1 or when the bit number N_BIT of 1 s included in the program data is greater than or equal to the second reference value N_R2 (S130) (No), it may be determined that a bit flip has occurred (S145). Accordingly, the comparator 165 may generate bit flip information INF_BF representing that a bit flip has occurred, and transfer the bit flip information INF_BF to the control logic 140.

The control logic 140 determines whether the program has failed, based on the received bit flip information INF_BF (S155). In the step S155, the control logic 140 may generate program status information INF_PS representing that the program has failed, and transfer the program status information INF_PS to the controller 200.

When it is determined that the program has failed because a bit flip has not occurred (S130) (Yes) but the program does not succeed (S150), in the step S155, the control logic 140 may transfer, to the controller 200, the program status information INF_PS representing a general program fail instead of a program fail caused by a bit flip.

On the other hand, when it is determined that the program has failed due to when a bit flip occurs (S130) (No), in the step S155, the control logic 140 may transfer, to the controller 200, the program status information INF_PS representing the program fail caused by a bit flip.

Accordingly, when the controller 200 receives the program status information INF_PS representing a program fail, the controller 200 can determine that the corresponding program fail is the program fail caused by a bit flip or the general program fail.

In accordance with the embodiment shown in FIG. 10, when the semiconductor memory device 100 receives program data, the semiconductor memory device 100 determines whether a bit flip has occurred in the program data (S130), and starts a program operation only when a bit flip does not occur (S130) (Yes).

Figure 11A:
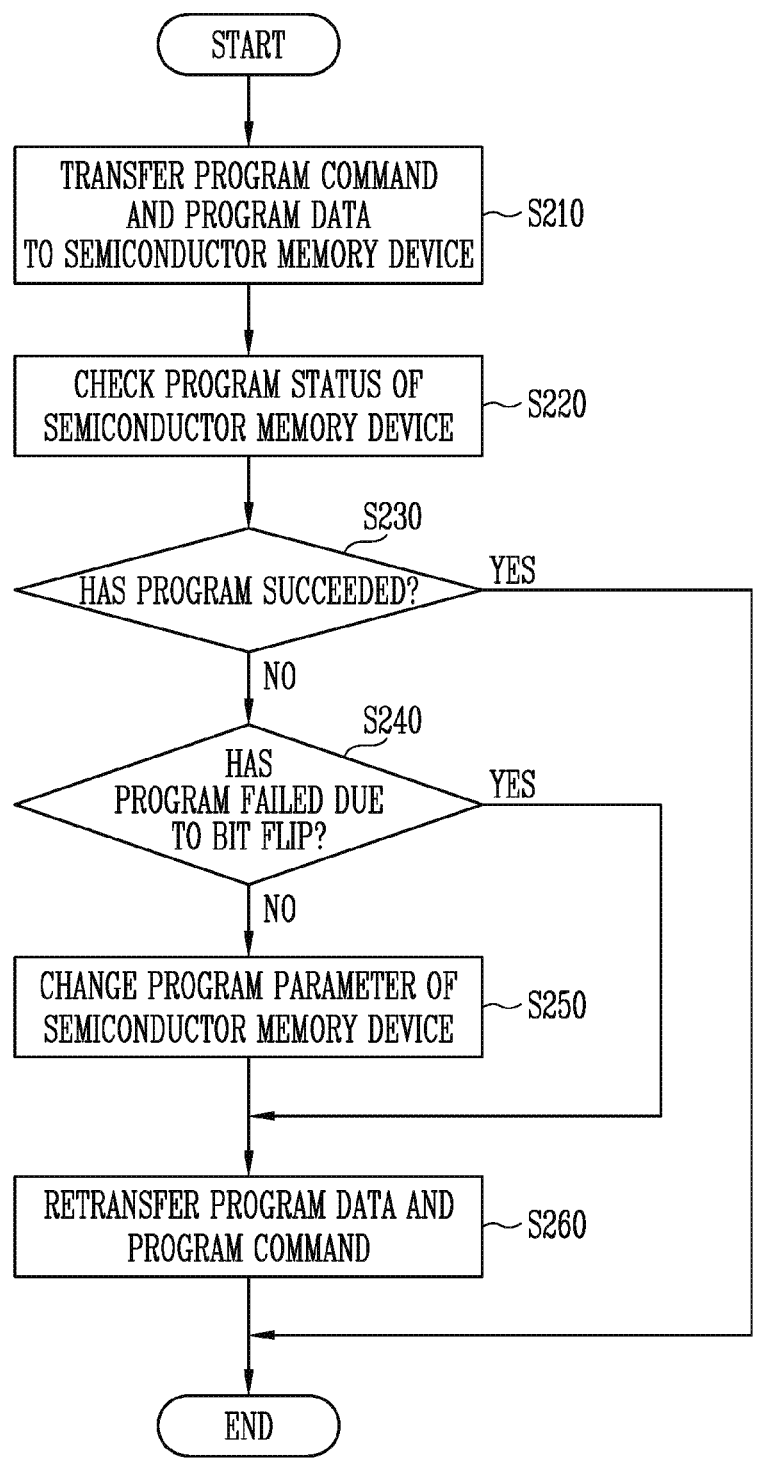
FIG. 11A is a flowchart illustrating an operating method of the controller in accordance with an embodiment of the present disclosure.

FIG. 11A is a flowchart illustrating an operating method of the controller 200 in accordance with an embodiment of the present disclosure.

Referring to FIG. 11A, in step S210, the controller 200 may transfer a program command and program data to the semiconductor memory device 100. Subsequently, the controller 200 checks a program status of the semiconductor memory device (S220). In the step S220, the controller 200 may check a program status according to program status information received from the semiconductor memory device 100.

As a result obtained by checking the program status, when a program succeeds (S230) (Yes), the entire program operation may be ended.

As a result obtained by checking the program status, when the program fails (S230) (No), the controller 200 determines whether the corresponding program fail is a program fail caused by a bit flip, based on the program status information INF_PS (S240).

When it is determined in the step S240 that the program fail is not the program fail caused by a bit flip (S240) (No), this may mean that the program fail is a general program fail. The case where the program fail is the general program fail is a case where program verification fails even when a program pulse is applied a maximum number of times to memory cells. Therefore, it is necessary to change a program parameter of the semiconductor memory device, which is used for a program operation. For example, various program parameters such as a magnitude of the program pulse and a maximum number of times the program pulse is applied may be changed. To this end, in step S250, the controller 200 may generate a command for changing a program parameter and transfer the generated command to the semiconductor memory device 100. The command may be a set parameter command. The semiconductor memory device 100 may change a program parameter for a program operation, based on the received set parameter command.

Subsequently, the controller 200 may retransfer the program data and the program command to the semiconductor memory device 100 (S260). The semiconductor memory device 100 may re-perform the program operation, based on the program parameter changed in the step S250.

Meanwhile, when it is determined in the step S240 that the program fail is the program fail caused by a bit flip (S240) (Yes), the controller 200 retransfers the program data and the program command to the semiconductor memory device 100 (S260). In many cases, a bit flip may temporarily occur due to noise, etc. in a process of transmitting the program data. Therefore, the program data is to be retransferred to the semiconductor memory device 100 to re-perform the program operation.

FIG. 11B is a flowchart illustrating an operating method of the controller 200 in accordance with another embodiment of the present disclosure.

Referring to FIG. 11B, steps S210, S220, S230, S240, S250, and S260 are substantially identical to those S210, S220, S230, S240, S250, and S260 shown in FIG. 11A. Therefore, repeated descriptions will be omitted.

In the embodiment shown in FIG. 11B, when it is determined in the step S240 that the program fail is the program fail caused by a bit flip (S240) (Yes), all memory blocks in a plane, on which the program operation has been attempted, may be registered as bad blocks (S265). In an embodiment, the memory cell array 110 may include a plurality of planes, and one plane may include a plurality of memory blocks. In this specification, a plurality of memory blocks sharing the read/write circuit 130 may be defined as one plane. In addition, when the memory cell array 110 includes a plurality of planes, the semiconductor memory device may include a plurality of read/write circuits.

Therefore, when a bit flip occurs because a defect occurs in a page buffer of a read/write circuit 130, a program operation on all memory blocks in a plane to which the corresponding read/write circuit 130 is connected might not be properly performed. The controller 200 can prevent an additional program fail by registering, as bad blocks, all the memory blocks in the plane, on which the program operation has been attempted.

Subsequently, the controller 200 may retransfer the program data and the program command to the semiconductor memory device 100 (S260). The controller 200 may change a program address such that the program operation is performed on a memory block included in another plane, and transfer the changed program address to the semiconductor memory device 100.

When the program fail caused by a bit flip is repeated even after the embodiment shown in FIG. 11A is performed, the embodiment shown in FIG. 11B may be performed. For example, when the program fail caused by a bit flip temporarily occurs once, this may be determined as a bit flip caused by a data transmission error. Therefore, when a bit flip temporarily occurs once, the controller 200 may control the semiconductor memory device 100 to re-perform the program operation in accordance with the embodiment shown in FIG. 11A. However, when the program fail caused by a bit flip repeatedly occurs a few times, this may be determined as a defect of the page buffer connected to the corresponding plane instead of a bit flip caused by the data transmission error. Therefore, the program fail caused by a bit flip occurs even when the program operation is repeated a few times in accordance with the embodiment shown in FIG. 11A, all memory blocks in the corresponding plane may be registered as bad blocks in the step S265 shown in FIG. 11B.

Figure 12:
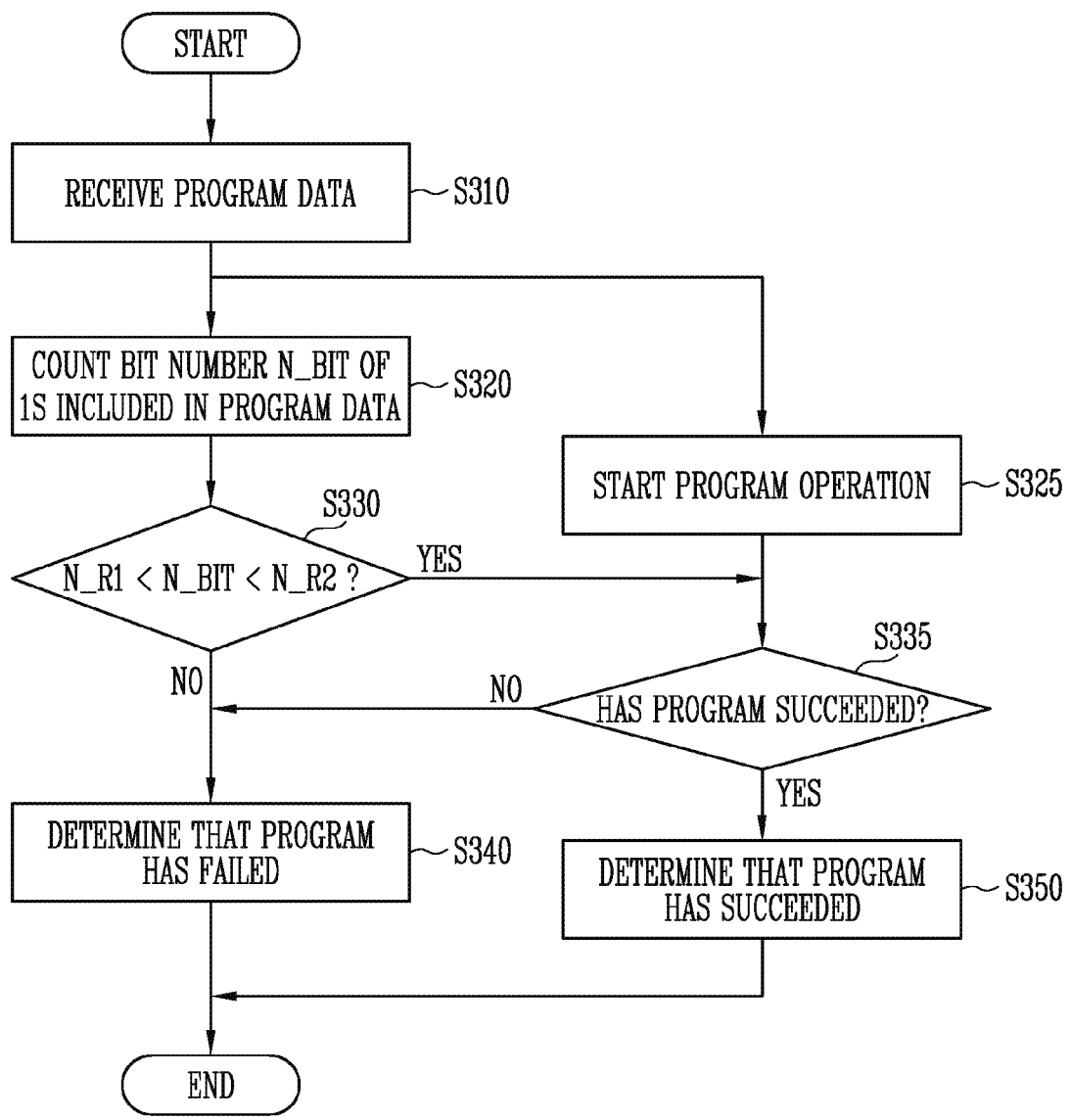
FIG. 12 is a flowchart illustrating an operating method of the semiconductor memory device in accordance with another embodiment of the present disclosure.

FIG. 12 is a flowchart illustrating an operating method of the semiconductor memory device 100 in accordance with another embodiment of the present disclosure.

Referring to FIG. 12, in step S310, the semiconductor memory device 100 may receive program data from the controller 200. The received program data may be stored in the first to third buffer BFR1 to BFR3 included in the read/write circuit 130.

In step S320, the bit counter 161 of the bit flip sensor 160 counts a bit number N_BIT of 1 s included in the program data. In the step S320, the program data may be any one of the most significant bit page data DATA_MSB, the central significant bit page data DATA_CSB, and the least significant bit page data DATA_LSB, which are shown in FIG. 8. Meanwhile, in parallel with the execution of step S320. the read and write circuit 130 may start a program operation based on the received program data (S325). In step S325. the control logic 140 controls the read and write circuits 130 and other peripheral circuits to start programming the program data into selected memory cells in the memory cell array.

In step S330, the comparator 165 of the bit flip sensor 160 determines whether the bit number N_BIT of 1 s is greater than a first reference value N_R1 and is less than a second reference value N_R2. That is, the comparator 165 determines whether the counted bit number N_BIT of 1 s is included in a certain range set by the first reference value N_R1 and the second reference value N_R2.

When the bit number N_BIT of 1 s included in the program data is less than or equal to the first reference value N_R1 or when the bit number N_BIT of 1 s included in the program data is greater than or equal to the second reference value N_R2 (S330) (No), it may be determined that a bit flip has occurred. Accordingly, it is determined that the program has failed (S340). The program operation which has already started by step S325 may be stopped according to the step S340.

On the other hand, when the bit number N_BIT of 1 s included in the program data is greater than the first reference value N_R1 and is less than the second reference value N_R2 (S330) (Yes), it may be determined that any bit flip has not occurred. Accordingly, it is determined whether the program operation which has already started by the step S325 has succeeded (S335). When the program fails (S335) (No), it is determined that the program has failed (S340). In the step S340, the control logic 140 may generate program status information INF_PS representing that the program has failed, and transfer the program status information INF_PS to the controller 200. Meanwhile, when the program succeeds (S335) (Yes), it is determined that the program has succeeded (S350). In the step S350, the control logic 140 may generate program status information INF_PS representing that the program has succeeded, and transfer the program status information INF_PS to the controller 200.

When it is determined that a bit flip has not occurred (S330) (Yes) and the program does not succeed (S335), in the step S340, the control logic 140 may transfer, to the controller 200, the program status information INF_PS representing a general program fail instead of a program fail caused by a bit flip.

On the other hand, when it is determined that the program has failed due to a bit flip occurring (S330) (No), in the step S340, the control logic 140 may transfer, to the controller 200, the program status information INF_PS representing the program fail caused by a bit flip.

Accordingly, when the controller 200 receives the program status information INF_PS representing a program fail, the controller 200 can determine that the corresponding program fail is the program fail caused by a bit flip or the general program fail.

Referring to the embodiment shown in FIG. 10, when the semiconductor memory device 100 receives program data, the semiconductor memory device 100 determines whether a bit flip has occurred in the program data (S130), and starts a program operation only when a bit flip does not occur (S130) (Yes).

On the other hand, referring to the embodiment shown in FIG. 12, when the semiconductor memory device 100 receives program data, the semiconductor memory device 100 starts the program operation, regardless of the determination whether a bit flip has occurred in the program data (S325). In accordance with the embodiment shown in FIG. 12, a case where any bit flip does not occur may have a program speed faster than that in the embodiment shown in FIG. 10. However, in accordance with the embodiment shown in FIG. 12, when the program fail is determined because it is determined that a bit flip has occurred in the state (S325) in which the program operation is started (S330) (No), it is necessary to invalidate a physical page on which the corresponding program operation has been performed. In this specification, the physical page may be a set of memory cells connected to the same word line in a memory block. The physical page may be a unit on which a program operation or a read operation is to be performed. Accordingly, the controller 200 invalidates the corresponding physical page when the program fails due to a bit flip. This will be described later with reference to FIGS. 13A and 13B.

Figure 13A:
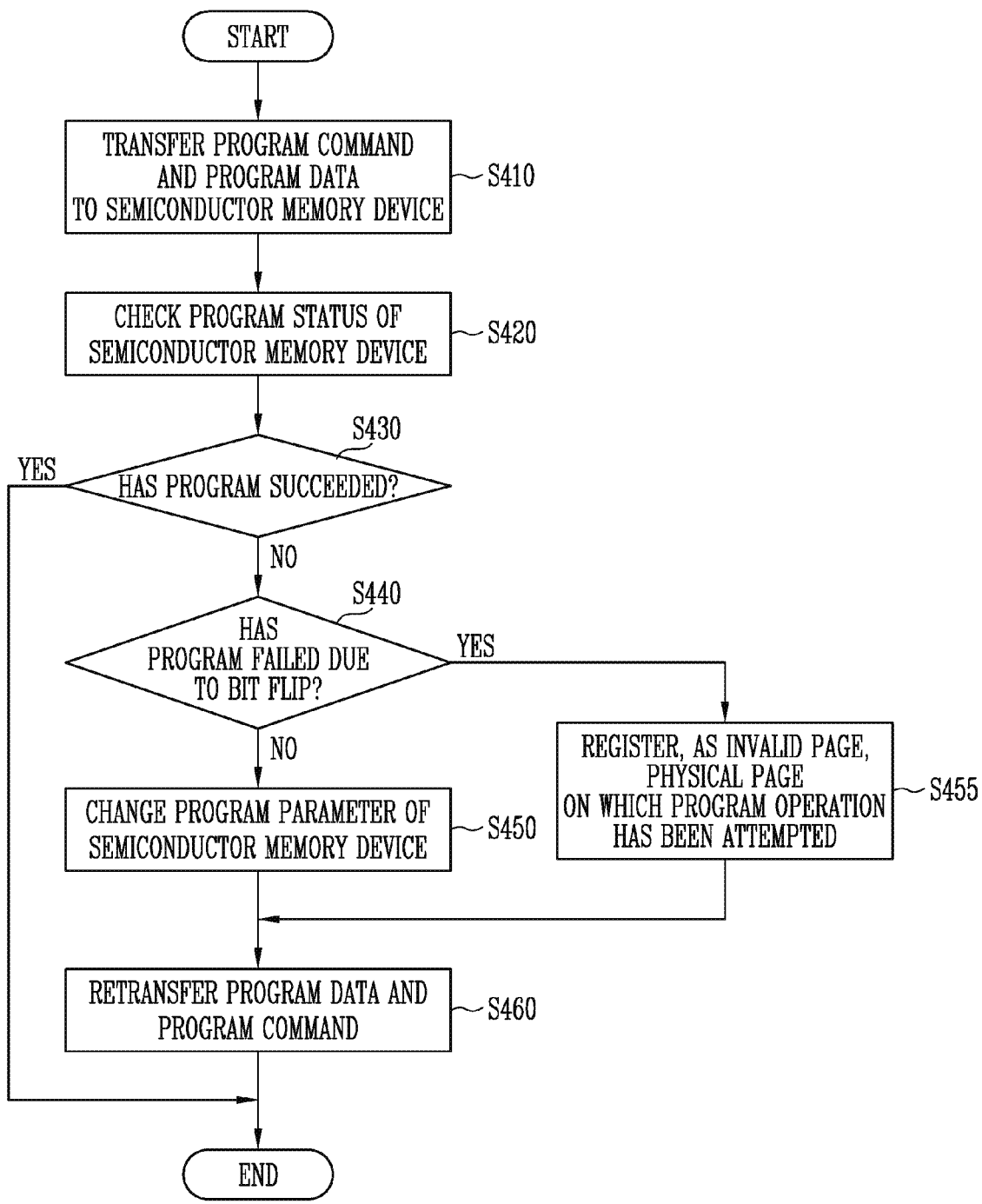
FIG. 13A is a flowchart illustrating an operating method of the controller in accordance with an embodiment of the present disclosure.

FIG. 13A is a flowchart illustrating an operating method of the controller 200 in accordance with an embodiment of the present disclosure.

Referring to FIG. 13A, in step S410, the controller 200 may transfer a program command and program data to the semiconductor memory device 100. Subsequently, the controller 200 checks a program status of the semiconductor memory device (S420). In the step S420, the controller 200 may check a program status according to program status information received from the semiconductor memory device 100.

As a result obtained by checking the program status, when a program succeeds (S430) (Yes), the entire program operation may be ended.

As a result obtained by checking the program status, when the program fails (S430) (No), the controller 200 determines whether the corresponding program fail is a program fail caused by a bit flip, based on the program status information INF_PS (S440).

When it is determined in the step S440 that the program fail is not the program fail caused by a bit flip (S440) (No), this may mean that the program fail is a general program fail. The case where the program fail is the general program fail is a case where program verification fails even when a program pulse is applied a maximum number of times to memory cells. Therefore, it is necessary to change a program parameter of the semiconductor memory device, which is used for a program operation. For example, various program parameters such as a magnitude of the program pulse and a maximum number of times the program pulse is applied may be changed. To this end, in step S450, the controller 200 may generate a command for changing a program parameter and transfer the generated command to the semiconductor memory device 100. The command may be a set parameter command. The semiconductor memory device 100 may change a program parameter for a program operation, based on the received set parameter command.

Subsequently, the controller 200 may retransfer the program data and the program command to the semiconductor memory device 100 (S460). The semiconductor memory device 100 may re-perform the program operation, based on the program parameter changed in the step S450.

Meanwhile, when it is determined in the step S440 that the program fail is the program fail caused by a bit flip (S440) (Yes), the controller 200 registers, as an invalid page, a physical page on which the program operation has been attempted according to the program command and the program data, which are transferred in the step S410 (S455). In accordance with the embodiment shown in FIG. 12, the semiconductor memory device 100 starts a program operation, regardless of whether a bit flip has occurred in the received program data. Therefore, it is necessary to invalidate the physical page on which the corresponding program operation has been performed when the program fails due to a bit flip. Accordingly, the controller 200 registers, as an invalid page, the physical page on which the program operation has been attempted based on the program data in which a bit flip has occurred in the step S440 (S455). Subsequently, the controller 200 retransfers the program data and the program command to the semiconductor memory device 100. The controller 200 may change a program address such that a physical page on which the program operation is to be performed, is changed, and transfer the changed program address to the semiconductor memory device 100.

Figure 13B:
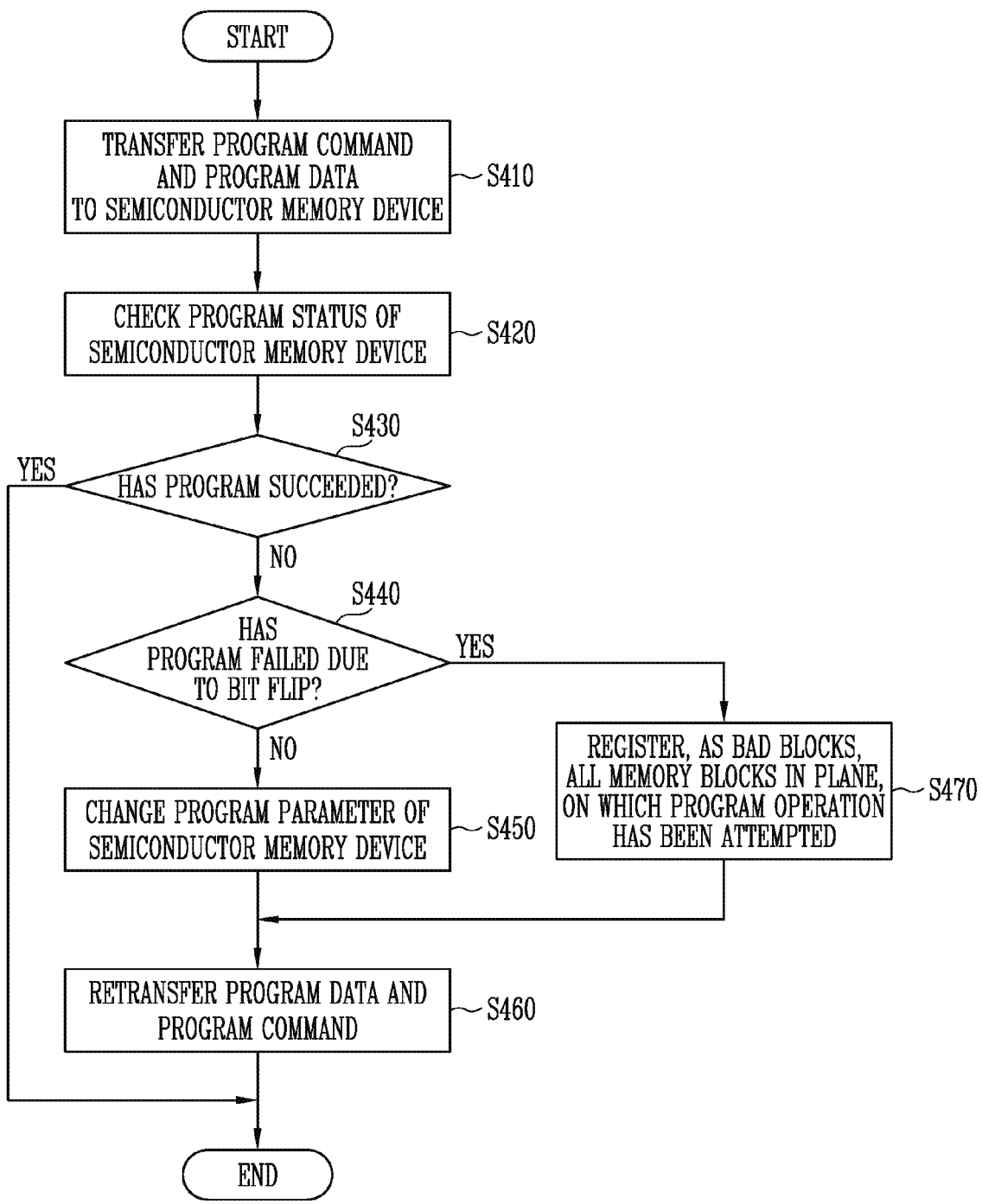
FIG. 13B is a flowchart illustrating an operating method of the controller in accordance with another embodiment of the present disclosure.

FIG. 13B is a flowchart illustrating an operating method of the controller 200 in accordance with another embodiment of the present disclosure.

Referring to FIG. 13B, steps S410, S420, S430, S440, S450, and S460 are substantially identical to those S410, S420, S430, S440, S450, and S460 shown in FIG. 13A. Therefore, repeated descriptions will be omitted.

In the embodiment shown in FIG. 13B, when it is determined in the step S440 that the program fail is the program fail caused by a bit flip (S440) (Yes), all memory blocks in a plane, on which the program operation has been attempted, may be registered as bad blocks (S470). In an embodiment, the memory cell array 110 may include a plurality of planes, and one plane may include a plurality of memory blocks. Therefore, when a bit flip occurs because a defect occurs in a page buffer of a read/write circuit 130, a program operation on all memory blocks in a plane to which the corresponding read/write circuit 130 is connected might not be properly performed. The controller 200 can prevent an additional program fail by registering, as bad blocks, all the memory blocks in the plane, on which the program operation has been attempted.

Subsequently, the controller 200 may retransfer the program data and the program command to the semiconductor memory device 100 (S460). The controller 200 may change a program address such that the program operation is performed on a memory block included in another plane, and transfer the changed program address to the semiconductor memory device 100.

When the program fail caused by a bit flip is repeated even after the embodiment shown in FIG. 13A is performed, the embodiment shown in FIG. 13B may be performed. For example, when the program fail caused by a bit flip temporarily occurs once, this may be determined as a bit flip caused by a data transmission error. Therefore, when a bit flip temporarily occurs once, the controller 200 may control the semiconductor memory device 100 to re-perform the program operation in accordance with the embodiment shown in FIG. 13A. However, when the program fail caused by a bit flip repeatedly occurs a few times, this may be determined as a defect of the page buffer connected to the corresponding plane instead of a bit flip caused by the data transmission error. Therefore, the program fail caused by a bit flip occurs even when the program operation is repeated a few times in accordance with the embodiment shown in FIG. 13A, all memory blocks in the corresponding plane may be registered as bad blocks in the step S470 shown in FIG. 13B.

Figure 14:
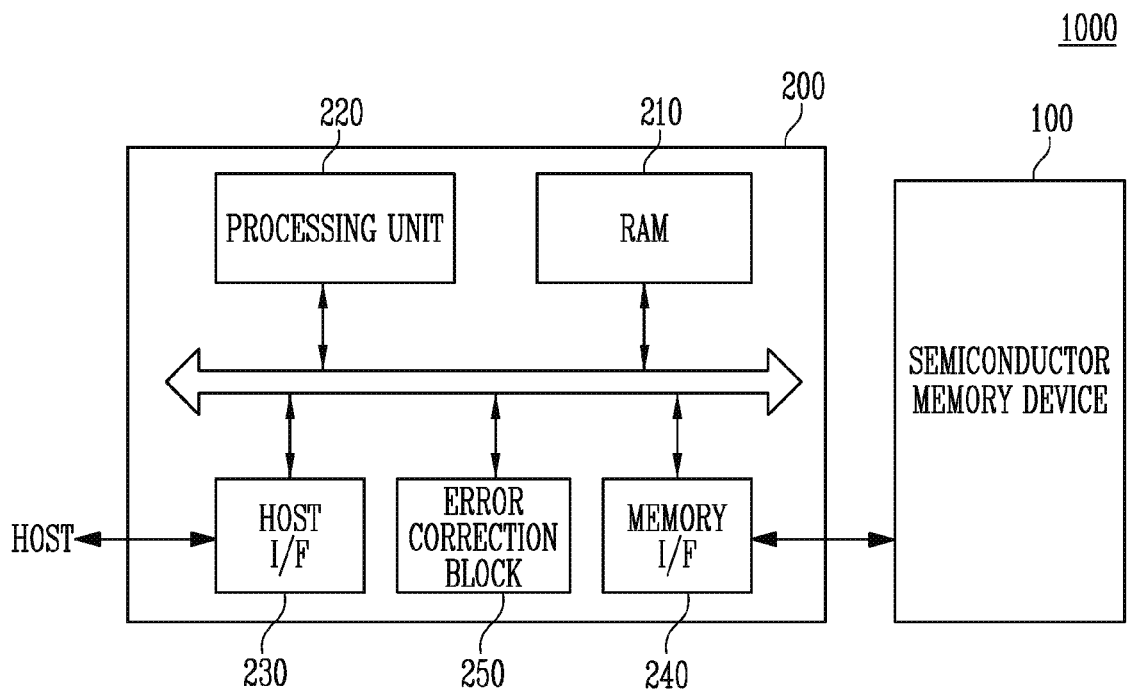
FIG. 14 is a block diagram illustrating an example of the controller shown in FIG. 1.

FIG. 14 is a block diagram illustrating an example of the controller 200 shown in FIG. 1.

Referring to FIG. 14, a controller 200 is connected to a semiconductor memory device 100 and a host HOST. The semiconductor memory device 100 may be the semiconductor memory device described with reference to FIG. 2. The controller 200 corresponds to the controller 200 shown in FIG. 1. Hereinafter, repeated descriptions will be omitted.

The controller 200 accesses the semiconductor memory device 100 in response to a request from the host HOST. For example, the controller 200 controls read, write, erase, and background operations of the semiconductor memory device 100. The controller 200 provides an interface between the semiconductor memory device 100 and the host HOST. The controller 200 drives firmware for controlling the semiconductor memory device 100.

The controller 200 includes a random access memory (RAM) 210, a processing unit 220, a host interface (I/F) 230, a memory interface (I/F) 240, and an error correction block 250. The RAM 210 is used as any one of a working memory of the processing unit 220, a cache memory between the semiconductor memory device 100 and the host HOST, and a buffer memory between the semiconductor memory device 100 and the host HOST. Also, the RAM 210 may be used as a command queue for temporarily storing commands to be transferred to the semiconductor memory device 100.

The processing unit 220 controls overall operations of the controller 200. In an embodiment, the processing unit 220 may drive firmware for controlling the overall operations of the controller 200.

The host I/F 230 includes a protocol for exchanging data between the host HOST and the controller 200. In an embodiment, the controller 200 communicates with the host HOST through at least one of various interface protocols such as a Universal Serial Bus (USB) protocol, a Multi-Media Card (MMC) protocol, a Peripheral Component Interconnection (PCI) protocol, a PCI-Express (PCI-E) protocol, an Advanced Technology Attachment (ATA) protocol, a Serial-ATA protocol, a Parallel-ATA protocol, a Small Computer Small Interface (SCSI) protocol, an Enhanced Small Disk Interface (ESDI) protocol, an Integrated Drive Electronics (IDE) protocol, and a private protocol.

The memory I/F 240 interfaces with the semiconductor memory device 100. For example, the memory I/F 240 may include a NAND interface or a NOR interface.

The error correction block 250 is configured to detect and correct an error of data received from the semiconductor memory device 100 by using an error correction code (ECC). The processing unit 220 may control the semiconductor memory device 100 to adjust a read voltage, based an error detection result of the error correction block 250, and perform re-reading.

The controller 200 and the semiconductor memory device 100 may be integrated into one semiconductor device. In an embodiment, the controller 200 and the semiconductor memory device 100 may be integrated into one semiconductor device, to constitute a memory card. For example, the controller 200 and the semiconductor memory device 100 may be integrated into one semiconductor device, to constitute a memory card such as a PC card (Personal Computer Memory Card International Association (PCMCIA)), a Compact Flash (CF) card, a Smart Media Card (SM or SMC), a memory stick, a Multi-Media Card (MMC, RS-MMC or MMCmicro), an SD Card (SD, miniSD, microSD or SDHC), or a Universal Flash Storage (UFS).

The controller 200 and the semiconductor memory device 100 may be integrated into one semiconductor device to constitute a semiconductor drive (solid state drive (SSD)). The semiconductor drive SSD includes a storage device configured to store data in a semiconductor memory. When the storage device including the controller 200 and the semiconductor memory device 100 is used as the semiconductor drive SSD, the operating speed of the host HOST connected to the storage device can be remarkably improved.

In another example, the controller 200 and the semiconductor memory device 100 may be provided as one of various components of an electronic device such as a computer, an Ultra Mobile PC (UMPC), a workstation, a net-book, a Personal Digital Assistant (PDA), a portable computer, a web tablet, a wireless phone, a mobile phone, a smart phone, an e-book, a Portable Multimedia Player (PMP), a portable game console, a navigation system, a black box, a digital camera, a 3-dimensional television, a digital audio recorder, a digital audio player, a digital picture recorder, a digital picture player, a digital video recorder, a digital video player, a device capable of transmitting/receiving information in a wireless environment, one of various electronic devices that constitute a home network, one of various electronic devices that constitute a computer network, one of various electronic devices that constitute a telematics network, an RFID device, or one of various components that constitute a computing system.

In an embodiment, the semiconductor memory device 100 and the storage device including the same may be packaged in various forms. For example, the semiconductor memory device 100 or the storage device may be packaged in a manner such as Package On Package (PoP), Ball Grid Arrays (BGAs), Chip Scale Packages (CSPs), Plastic Leaded Chip Carrier (PLCC), Plastic Dual In-line Package (PDIP), die in Waffle pack, die in wafer form, Chip On Board (COB), CERamic Dual In-line Package (CERDIP), plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi-Chip Package (MCP), Wafer-level Fabricated Package (WFP), or Wafer-level processed Stack Package (WSP).

Figure 15:
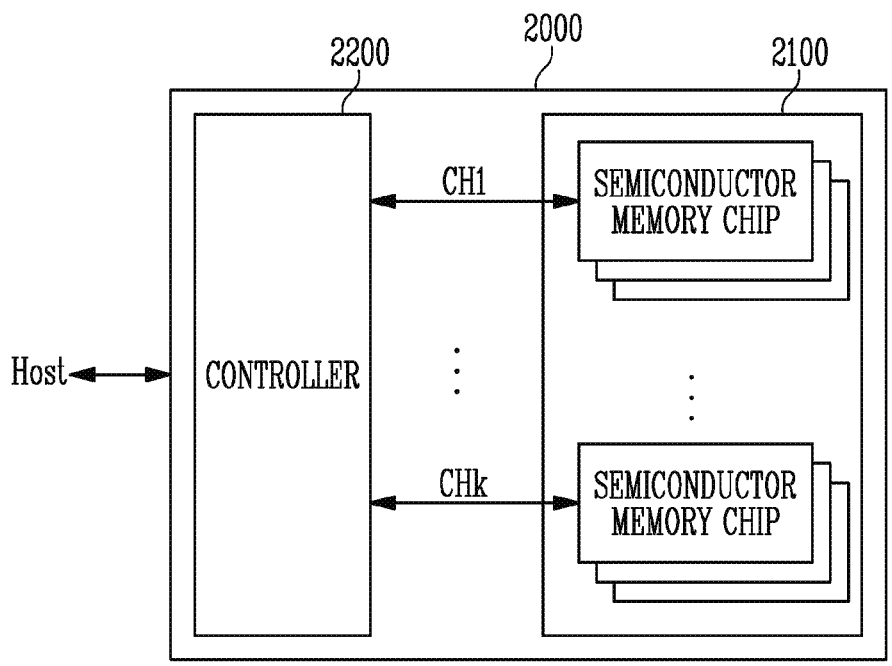
FIG. 15 is a block diagram illustrating an application example of the storage device shown in FIG. 1.

FIG. 15 is a block diagram illustrating an application example of the storage device shown in FIG. 1.

Referring to FIG. 15, the storage device 2000 includes a semiconductor memory device 2100 and a controller 2200. The semiconductor memory device 2100 includes a plurality of semiconductor memory chips. The plurality of semiconductor memory chips are divided into a plurality of groups.

In FIG. 15, there is illustrated a case where the plurality of groups communicate with the controller 2200 through first to kth channels CH1 to CHk. Each semiconductor memory chip may be configured and operated identically to the semiconductor memory device 100 described with reference to FIG. 2.

Each group communicates with the controller 2200 through one common channel. The controller 2200 is configured identically to the controller 200 described with reference to FIG. 14, and controls the plurality of memory chips of the semiconductor memory device 2100 through the plurality of channels CH1 to CHk.

Figure 16:
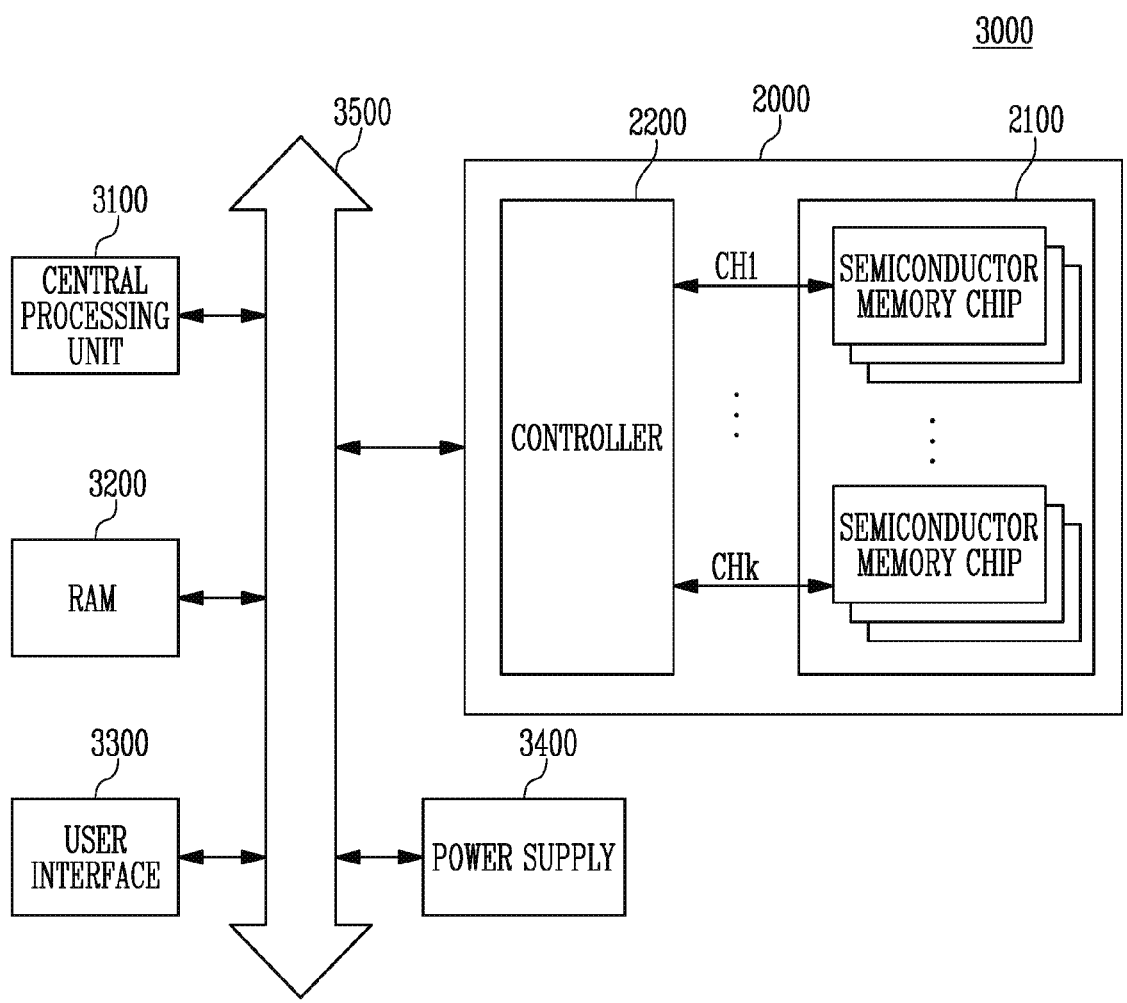
FIG. 16 is a block diagram illustrating a computing system including the storage device described with reference to FIG. 15.

FIG. 16 is a block diagram illustrating a computing system including the storage device described with reference to FIG. 15.

Referring to FIG. 16, the computing system 3000 includes a central processing unit 3100, a RAM 3200, a user interface 3300, a power supply 3400, a system bus 3500, and a storage device 2000.

The storage device 2000 is electrically connected to the central processing unit 3100, the RAM 3200, the user interface 3300, and the power supply 3400 through the system bus 3500. Data supplied through user interface 3300 or data processed by the central processing unit 3100 are stored in the storage device 2000.

In FIG. 16, there is illustrated a case where the semiconductor memory device 2100 is connected to the system bus 3500 through the controller 2200. However, the semiconductor memory device 2100 may be directly connected to the system bus 3500. The function of the controller 2200 may be performed by the central processing unit 3100 and the RAM 3200.

In FIG. 16, there is illustrated a case where the storage device 2000 described with reference to FIG. 15 is provided. However, the storage device 2000 may be replaced by the storage device including the controller 200 and the semiconductor memory device 100, which is described with reference to FIG. 14.

In accordance with the present disclosure, there can be provided a semiconductor memory device, a controller, and operating methods thereof, which have improved operational reliability.

While the present disclosure has been shown and described with reference to certain embodiments thereof, it will be understood by those skilled in the art that various changes in form and details may be made therein without departing from the spirit and scope of the present disclosure as defined by the appended claims and their equivalents. Therefore, the scope of the present disclosure should not be limited to the above-described embodiments but should be determined by not only the appended claims but also the equivalents thereof.

In the above-described embodiments, all steps may be selectively performed or part of the steps and may be omitted. In each embodiment, the steps are not necessarily performed in accordance with the described order and may be rearranged. The embodiments disclosed in this specification and drawings are only examples to facilitate an understanding of the present disclosure, and the present disclosure is not limited thereto. That is, it should be apparent to those skilled in the art that various modifications can be made on the basis of the technological scope of the present disclosure.

Meanwhile, the embodiments of the present disclosure have been described in the drawings and specification. Although specific terminologies are used here, those are only to explain the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein.

What is claimed is:

1. A semiconductor memory device comprising:
   a memory cell array including a plurality of memory cells;
   a read/write circuit configured to receive and store program data, from a controller, in a page buffer of the read/write circuit, and perform a program operation, based on the program data, on selected memory cells among the plurality of memory cells;
   a bit flip sensor configured to receive the program data from the page buffer included in the read/write circuit, and determine whether a bit flip has occurred in the program data due to a process of transferring the program data to the page buffer from the controller or due to a defect in the page buffer; and
   control logic configured to control the program operation performed by the read/write circuit, and generate, based on a determination result of the bit flip sensor, program status information.

2. The semiconductor memory device of claim 1, wherein the bit flip sensor includes:
   a bit counter configured to count a number of first bits having a first bit value among bits included in the program data;
   reference value storage configured to store at least one reference value for determining whether a bit flip has occurred in the program data; and
   a comparator configured to generate bit flip information representing whether or not a bit flip has occurred in the program data, by comparing the number of first bits with the at least one reference value.

3. The semiconductor memory device of claim 2, wherein the first bit value is 1.

4. The semiconductor memory device of claim 2, wherein the first bit value is 0.

5. The semiconductor memory device of claim 2, wherein the at least one reference value includes a first reference value and a second reference value greater than the first reference value,
   wherein, when the number of first bits is greater than the first reference value and is less than the second reference value, the comparator is configured to generate the bit flip information representing that a bit flip has not occurred in the program data.

6. The semiconductor memory device of claim 5, wherein, when the program operation based on the program data fails, the control logic is configured to generate, based on the bit flip information, the program status information representing a program fail regardless of whether a bit flip has occurred.

7. The semiconductor memory device of claim 2, wherein the at least one reference value includes a first reference value and a second reference value greater than the first reference value, wherein, when the number of first bits is less than or equal to the first reference value or when the number of first bits is greater than or equal to the second reference value, the comparator is configured to generate the bit flip information representing that a bit flip has occurred in the program data.

8. The semiconductor memory device of claim 7, wherein the control logic is configured to generate, based on the bit flip information, the program status information representing that a program fail caused by a bit flip has occurred.

9. A method for operating a semiconductor memory device, the method comprising:
receiving program data, from a controller, to be programmed into a memory by a program operation performed by a read/write circuit;
storing the program data in a page buffer included in the read/write circuit;
determining whether a bit flip has occurred in the program data due to a process of transferring the program data to the page buffer from the controller or due to a defect in the page buffer; and
determining whether or not the program operation has succeeded, based on the determining whether a bit flip has occurred.

10. The method of claim 9, wherein the determining whether a bit flip has occurred in the program data includes:
counting a number of first bits having a first bit value included in the program data;
comparing the number of first bits with at least one reference value; and
determining, based on the comparison result, whether or not a bit flip has occurred in the program data.

11. The method of claim 10, wherein the at least one reference value includes a first reference value and a second reference value greater than the first reference value,
wherein, the determining whether or not a bit flip has occurred in the program data based on the comparison result comprises determining that a bit flip has not occurred in the program data when the number of first bits is greater than the first reference value and is less than the second reference value.

12. The method of claim 11, wherein the determining whether or not the program operation has succeeded, based on the determination of whether a bit flip has occurred, includes:
starting the program operation; and
determining whether or not the program operation has succeeded.

13. The method of claim 10, wherein the at least one reference value includes a first reference value and a second reference value greater than the first reference value,
wherein, the determining whether or not a bit flip has occurred in the program data based on the comparison result comprises determining that a bit flip has occurred in the program data when the number of first bits is less than or equal to the first reference value or when the number of first bits is greater than or equal to the second reference value.

14. The method of claim 13, wherein, the determining whether or not the program operation has succeeded, based on the determination of whether a bit flip has occurred, comprises determining that the program
operation has failed when the number of first bits is less than or equal to the first reference value or when the number of first bits is greater than or equal to the second reference value.

15. A method for operating a controller for controlling a semiconductor memory device, the method comprising:
transferring program data to a page buffer in the semiconductor memory device;
storing the program data in the page buffer;
checking a program status of the semiconductor memory device; and
controlling a program operation of the semiconductor memory device, based on whether a bit flip, due to a process of transferring the program data to the page buffer or due to a defect in the page buffer, has occurred in the program data when the program operation of the semiconductor memory device fails.

16. The method of claim 15, wherein, checking the program status of the semiconductor memory device comprises determining, by checking program status information received from the semiconductor memory device, whether a fail of the program operation is caused by a bit flip.

17. The method of claim 16, wherein controlling the program operation of the semiconductor memory device, based on whether a bit flip has occurred in the program data, when the program operation fails due to a bit flip, includes:
registering, as an invalid page, a physical page on which the program operation has been attempted; and
retransferring the program data to the semiconductor memory device by changing a program address.

18. The method of claim 16, wherein controlling the program operation of the semiconductor memory device, based on whether a bit flip has occurred in the program data, when the program operation fails due to a bit flip, includes:
registering, as bad blocks, all memory blocks in a plane, on which the program operation has been attempted; and
retransferring the program data to the semiconductor memory device by changing a program address.

19. The method of claim 16, wherein controlling the program operation of the semiconductor memory device, based on whether a bit flip has occurred in the program data, when the program operation fails regardless of a bit flip, includes:
changing a program parameter of the semiconductor memory device; and
retransferring the program data to the semiconductor memory device.

* * * * *